United States Patent
Kim et al.

(10) Patent No.: US 9,318,505 B2
(45) Date of Patent: Apr. 19, 2016

(54) DISPLAY PANEL AND METHOD OF MANUFACTURING THE SAME

(71) Applicant: Samsung Display Co., Ltd., Yongin (KR)

(72) Inventors: Woong-Kwon Kim, Cheonan-si (KR); Sang-Ho Kim, Cheonan-si (KR); Joong-Tae Kim, Icheon-si (KR); Min-Ha Hwang, Seoul (KR); In-Woo Kim, Asan-si (KR); Woo-Sung Sohn, Seoul (KR); Ki-Hun Jeong, Cheonan-si (KR); Kweon-Sam Hong, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/304,430

(22) Filed: Jun. 13, 2014

(65) Prior Publication Data
US 2015/0162355 A1 Jun. 11, 2015

(30) Foreign Application Priority Data
Dec. 5, 2013 (KR) .................. 10-2013-0150822

(51) Int. Cl.
| | |
|---|---|
| *H01L 27/12* | (2006.01) |
| *H01L 29/66* | (2006.01) |
| *H01L 29/49* | (2006.01) |
| *H01L 29/786* | (2006.01) |

(52) U.S. Cl.
CPC .......... *H01L 27/1214* (2013.01); *H01L 27/124* (2013.01); *H01L 27/1259* (2013.01); *H01L 29/66545* (2013.01); *H01L 27/12* (2013.01); *H01L 27/1225* (2013.01); *H01L 29/4908* (2013.01); *H01L 29/66757* (2013.01); *H01L 29/66765* (2013.01); *H01L 29/78621* (2013.01)

(58) Field of Classification Search
CPC ............ H01L 27/1214; H01L 27/1259; H01L 29/66545; H01L 21/775; H01L 27/12; H01L 29/66765; H01L 29/4908; H01L 29/66757; H01L 29/78621
USPC ...................... 257/59, 72, E33.056, E33.053, 257/E21.499; 438/149, 161, 158; 349/156, 349/155, 187
See application file for complete search history.

(56) References Cited

U.S. PATENT DOCUMENTS

| | | | |
|---|---|---|---|
| 7,525,631 B2 | 4/2009 | Lee et al. | |
| 7,656,496 B2 * | 2/2010 | Kim et al. | ..................... 349/155 |
| 7,894,024 B2 | 2/2011 | Dong | |
| 8,169,585 B2 | 5/2012 | Chen et al. | |

(Continued)

FOREIGN PATENT DOCUMENTS

| | | |
|---|---|---|
| JP | 2006-330470 | 12/2006 |
| KR | 10-0687352 | 2/2007 |
| KR | 10-0904526 | 6/2009 |

*Primary Examiner* — Thinh T Nguyen
(74) *Attorney, Agent, or Firm* — H.C. Park & Associates, PLC

(57) ABSTRACT

A display panel includes a first substrate including a switching device array, a second substrate spaced apart from the first substrate, a column spacer maintaining a cell gap between the first substrate and the second substrate, the first substrate includes a gate line on a base substrate and extending in a direction, a data line crossing with the gate line, a switching device electrically connected to the gate line and the data line and including a gate electrode, a source electrode and a drain electrode, a pixel electrode connected to the switching device and a dummy pattern adjacent to the column spacer.

20 Claims, 19 Drawing Sheets

(56) References Cited

U.S. PATENT DOCUMENTS

| | | |
|---|---|---|
| 8,253,916 B2 | 8/2012 | Park et al. |
| 2003/0112405 A1* | 6/2003 | Kim et al. ............ 349/156 |
| 2005/0190338 A1* | 9/2005 | Lim ...................... 349/156 |
| 2006/0125990 A1 | 6/2006 | Lee et al. |
| 2007/0184367 A1 | 8/2007 | Kim et al. |
| 2008/0049176 A1* | 2/2008 | Kim et al. ............ 349/114 |
| 2009/0323007 A1* | 12/2009 | Shim .................... 349/155 |
| 2011/0261309 A1* | 10/2011 | Huang et al. ......... 349/144 |
| 2013/0021552 A1 | 1/2013 | Tomioka et al. |

\* cited by examiner

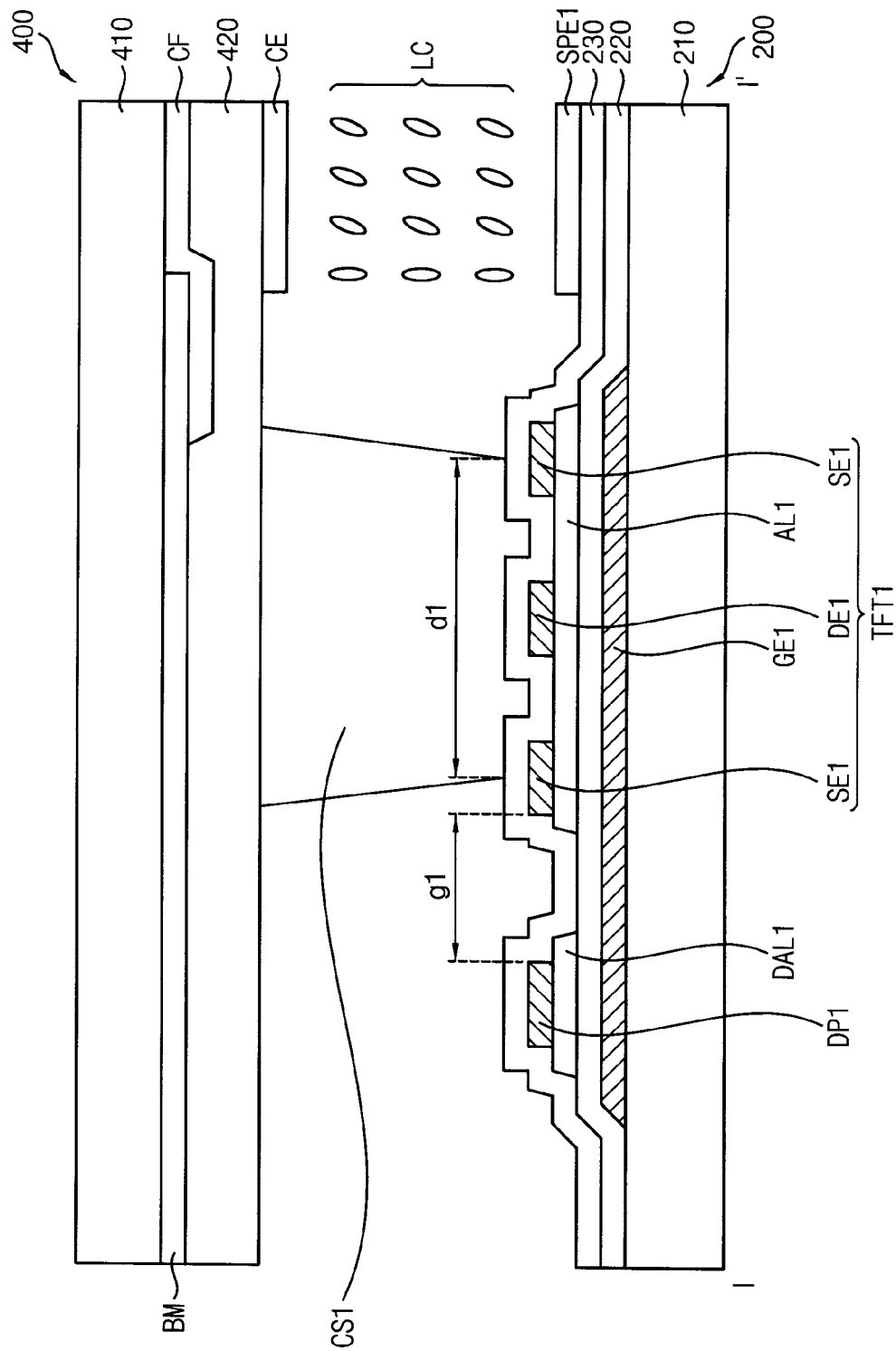

DISPLAY PANEL AND METHOD OF MANUFACTURING THE SAME

CROSS REFERENCE TO RELATED APPLICATION

This application claims priority from and the benefit of Korean Patent Application No. 10-2013-0150822, filed on Dec. 5, 2013, which is hereby incorporated by reference for all purposes as if fully set forth herein.

BACKGROUND

1. Field

Exemplary embodiments of the present invention relate to a display panel and a method of manufacturing the display panel. More particularly, exemplary embodiments of the present invention relate to a display panel capable of maintaining a cell gap of the display panel and a method of manufacturing the display panel.

2. Discussion of the Background

In a liquid crystal display (hereinafter, "LCD") device, the light transmissivity through an array substrate and an opposing substrate may be adjusted to display an image according to an arrangement of liquid crystals of a liquid crystal layer between the substrates. A plurality of signal electrodes may be disposed on the array substrate to control the arrangement of liquid crystals.

In the LCD device, a light blocking pattern, a color filter pattern, an overcoating layer and a column spacer may be disposed on the opposing substrate. The light blocking pattern may correspond to a boundary of pixel areas. The color filter pattern may correspond to the pixel areas. The overcoating layer may reduce outgassing of the light blocking pattern and the color filter pattern. The column spacer may maintain cell gap between the array substrate and the opposing substrate.

However, when the LCD device is assembled, a cell gap of the array substrate and the facing substrate may be changed by a height or thickness difference between the column spacers.

SUMMARY

Exemplary embodiments of the present invention provide a display panel capable of maintaining a cell gap of a display panel.

Exemplary embodiments of the present invention also provide a method of manufacturing the display panel.

Additional features of the invention will be set forth in the description which follows, and in part will be apparent from the description, or may be learned by practice of the invention.

An exemplary embodiment of the present invention discloses a display panel including a first substrate comprising a switching device array, a second substrate spaced apart from the first substrate, and a column spacer supporting a cell gap between the first substrate and the second substrate. The first substrate includes a gate line on a base substrate and extending in a direction, a data line crossing with the gate line, a switching device electrically connected to the gate line and the data line and including a gate electrode, a source electrode and a drain electrode, a pixel electrode connected to the switching device, and a dummy pattern adjacent to the column spacer.

An exemplary embodiment of the present invention also discloses a method of manufacturing a display panel in which a gate metal pattern is formed on a base substrate. The gate metal pattern includes a gate electrode and a gate line. An active pattern overlaps the gate electrode. A source metal pattern including a data line crossing with the gate line, a source electrode contacting with the active pattern, a drain electrode spaced apart from the source electrode and a dummy pattern spaced apart from the data line, the source electrode and the drain electrode are formed. A pixel electrode is formed to contact with the drain electrode. A column spacer is formed to overlap the gate line.

According to the exemplary embodiments of the present invention, a dummy pattern adjacent to a column spacer is formed to prevent a difference of cell gap of a display panel by the column spacer. In this manner, changing of cell gap by misaligning between a first substrate and a second substrate may be prevented. Thus, display characteristic may be improved by removing display imbalance created by changing of cell gap.

Furthermore, a dummy pattern is formed in the same layer as a source electrode, a gate electrode or a data line, thereby reducing manufacturing costs associated with forming the dummy pattern.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIGS. 11, 12, 13, 14, 15, 16, 17, 18, and 19 are cross-sectional views illustrating an exemplary embodiment of a method of manufacturing a display panel according to the present invention.

DETAILED DESCRIPTION OF THE ILLUSTRATED EMBODIMENTS

Figure 1:
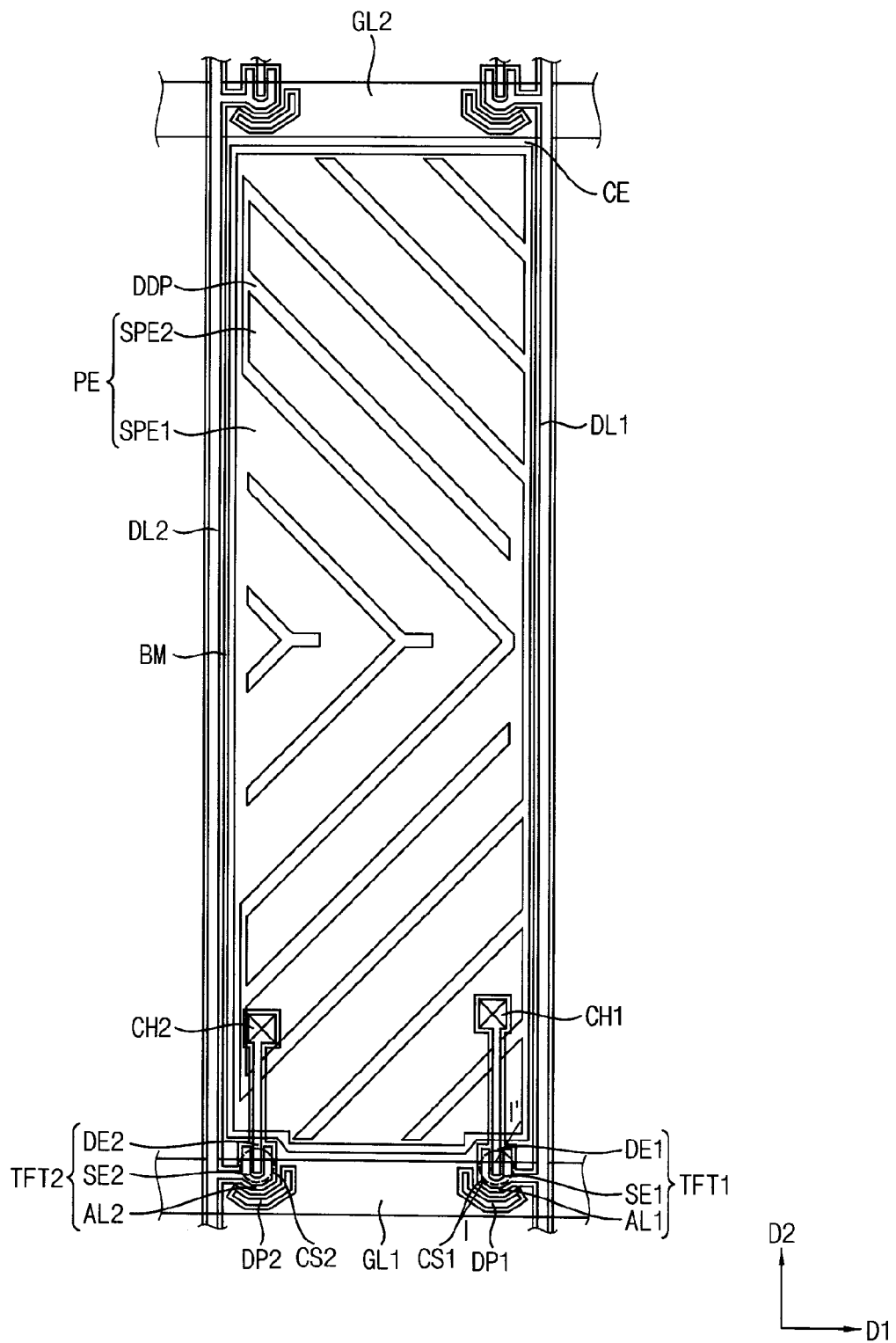
FIG. 1 is a plan view illustrating a display panel in accordance with a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
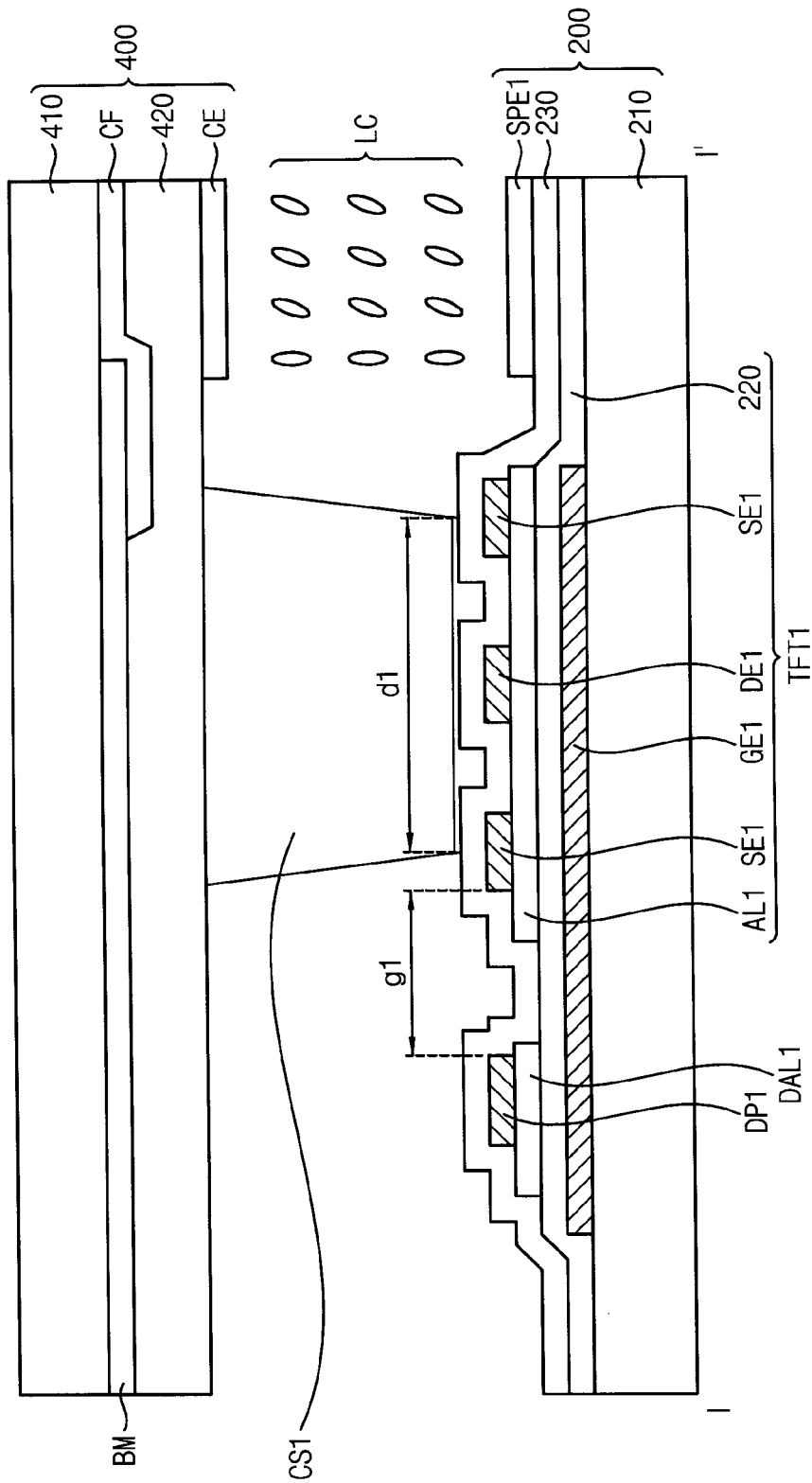
FIG. 2 is a cross-sectional view taken along the line I-I' of FIG. 1.

FIG. 1 is a plan view illustrating a display panel in accordance with a first exemplary embodiment of the invention. FIG. 2 is a cross-sectional view taken along the line I-I' of FIG. 1.

Referring to FIGS. 1 and 2, a display panel 1000 includes a first substrate 200, a second substrate 400 facing the first substrate 200, a liquid crystal layer LC between the first substrate 200 and the second substrate 400, and column spacers CS1 and CS2 capable of maintaining a cell gap between the first substrate 200 and the second substrate 400.

The first substrate 200 includes a first base substrate 210, gate lines GL1 and GL2, data lines DL1 and DL2, a gate electrode GE1, thin film transistors TFT1 and TFT2 electrically connected to the gate lines GL1 and GL2 and data lines DL1 and DL2, and having source electrodes SE1 and SE2 and drain electrodes DE1 and DE2, respectively, a pixel electrode PE and dummy patterns DP1 and DP2, respectively.

Although the thin film transistors TFT1 and TFT2 have a bottom-gate structure shown in FIG. 2, the structure of the thin film transistor of the first substrate according to exemplary embodiments of the invention is not limited thereto. For example, the thin film transistor of the first substrate may have a top-gate structure, a dual-gate structure, or other structures.

The first base substrate 210 may include a transparent insulation substrate. For example, the first base substrate 210 may include at least one of glass, quartz, plastic, polyethylene terephthalate resin, polyethylene resin, and polycarbonate resin, etc.

The gate lines GL1 and GL2 extend in a first direction D1 on the first base substrate 210. A gate on/off voltage may be applied to the gate lines GL1 and GL2 from a gate driving part (not illustrated). The gate lines GL1 and GL2 may include, for example, at least one of aluminum (Al), gold (Au), silver (Au), copper (Cu), iron (Fe), and nickel (Ni), etc.

The thin film transistor TFT1 may include a gate electrode GE1, a gate insulation layer 220, an active layer AL1, source electrode SE1, and a drain electrode DE1.

The gate electrode GE1 may protrude from the gate line GL1 in a second direction D2 substantially perpendicular to the first direction D1. The gate electrode GE may be integrally formed with the gate line GL1.

The thin film transistor TFT2 may include a gate electrode GE2 (not shown in FIG. 1), a gate insulation layer 220, an active layer AL2, a second source electrode SE2, and a second drain electrode DE2.

The gate electrode GE2 may protrude from the gate line GL1 in the second direction D2 substantially perpendicular to the first direction D1. The gate electrode GE2 may be integrally formed with the gate line GL1.

The gate insulation layer 220 may be disposed on the first base substrate 210 covering the gate line GL1 and the gate electrodes GE1 and GE2. The gate insulation layer 220 may include a transparent insulation material such as, for example, at least one of silicon oxide, and silicon nitride, etc.

The active layer AL1 may be disposed on the gate insulation layer 220. The active layer AL1 may overlap the gate electrode GE1. The active layer AL1, which may include, for example, amorphous silicon may be formed on the gate insulation layer 220 in an area where the gate electrode GE1 is formed. The active layer AL1 may include, for example, at least one of indium (In), zinc (Zn), gallium (Ga), tin (Sn), hafnium (Hf), and other suitable materials.

The active layer AL1 may include an oxide semiconductor such as, for example, indium gallium zinc oxide (IGZO), indium tin zinc oxide (ITZO), hafnium indium zinc oxide (HIZO), etc.

Dummy active layers DAL1 and DAL2 may be disposed around the thin film transistors TFT1 and TFT2, respectively. The dummy active layers DAL1 and DAL2 may be disposed on the gate insulation layer 220. The dummy active layers DAL1 and DAL2 may overlap the gate electrode GE1. The dummy active layer DAL1 may be formed in the same layer as the active layer AL1. The dummy active layer DAL2 may be formed in the same layer as the active layer AL2. The dummy active layer DAL1 may contact a portion of the dummy pattern DP1. An area of the dummy active layer DAL1 may be greater than an area of the dummy pattern DP1.

The dummy active layer DAL1, which may include, for example, amorphous silicon may be formed on the gate insulation layer 220 in an area where the gate electrode GE1 is formed. The dummy active layer DAL1 may include at least one of, for example, indium (In), zinc (Zn), gallium (Ga), tin (Sn), and hafnium (Hf), etc.

The dummy active layer DAL1 may include an oxide semiconductor such as, for example, indium gallium zinc oxide (IGZO), indium tin zinc oxide (ITZO), hafnium indium zinc oxide (HIZO), or other suitable materials.

The data lines DL1 and DL2 may be disposed on the gate insulation layer 220. The data lines DL1 and DL2 may extend in the second direction D2. The data lines DL1 and DL2 may cross with the gate lines GL1 and GL2, respectively. A pixel area may be defined by the data lines DL1 and DL2 and the gate lines GL1 and GL2, respectively. A data voltage may be applied to the data line DL1, DL2 from a data driving part (not shown). The data lines DL1 and DL2 may include substantially the same material as the gate lines GL1 and GL2. For example, the data lines DL1 and DL2 may include for example, at least one of aluminum (Al), molybdenum (Mo), chromium (Cr), tantalum (Ta), titanium (Ti), tungsten (W), copper (Cu), silver (Ag), etc.

The source electrode SE1 may be disposed on the active layer AL1 and may overlap a first end portion of the active layer AL1. For example, the source electrode SE1 may protrude from the data line DL1 in the first direction D1. The source electrode SE1 may have a U-shape.

The drain electrode DE1 may be spaced apart from the source electrode SE1. The drain electrode DE1 may be disposed in the same layer as the source electrode SE1. The drain electrode DE1 may be disposed in a middle of the source electrode SE1 having the U-shape. Thus, the drain electrode DE1 may overlap the active layer AL1 and extend to the data line DL1.

The drain electrode DE1 may include substantially the same material as the source electrode SE1. For example, the source electrode SE1 and the drain electrode DE1 may include at least one of, for example, aluminum (Al), gold (Au), silver (Ag), copper (Cu), iron (Fe), and nickel (Ni), etc.

The dummy patterns DP1 and DP2 may be disposed around the thin film transistors TFT1 and TFT2 respectively. The dummy pattern DP1 may be disposed adjacent to the column spacer CS1. The dummy pattern DP1 may overlap the gate electrode GE1. The dummy patterns DP1 and DP2 may be disposed in the same layer as the source electrodes SE1 and SE2, respectively, and the drain electrodes DE1 and DE2, respectively. The dummy patterns DP1 and DP2 may have an arc shape partially surrounding the source electrodes SE1 and SE2, respectively.

The dummy patterns DP1 and DP2 may include substantially the same material as the source electrodes SE1 and SE2 and the drain electrodes DE1 and DE2. For example, the dummy patterns DP1 and DP2 may include, for example, at least one of aluminum (Al), gold (Au), silver (Ag), copper (Cu), iron (Fe), and nickel (Ni), etc.

The dummy patterns DP1 and DP2 may be in an electrical floating state. A passivation layer 230 may be disposed on the source electrode SE1, the drain electrode DE1 and the dummy patterns DP1 and DP2. The passivation layer 230 may cover the source electrodes SE1 and SE2, the drain electrodes DE1 and DE2, and the dummy patterns DP1 and DP2. The passivation layer 230 may include substantially the same material as the gate insulation layer 220. For example, the passivation layer 230 may include, for example, at least one of silicon oxide, and silicon nitride, etc.

The pixel electrode PE may be electrically connected to the thin film transistors TFT1 and TFT2. In an exemplary embodiment, the pixel electrode PE may include a first sub-electrode SPE1 and a second sub-electrode SPE2 that are electrically separated from each other. A domain division pattern DDP is formed in the first sub-electrode SPE1 and the second sub-electrode SPE2, respectively. The domain division pattern DDP has a V-shaped opening pattern in which a portion of the first sub-electrode SPE1 and a portion of the second sub-electrode SPE2 have been partially removed. Alternatively, the domain division pattern DDP may have a protrusion pattern.

The first sub-electrode SPE1 may be electrically connected to the drain electrode DE1 through a first contact hole CH1. The second sub-electrode SPE2 may be electrically connected to the second drain electrode DE2 through a second contact hole CH2.

The second substrate 400 includes a second base substrate 410 disposed opposing the first base substrate 210, a light blocking pattern BM, a color filter CF, an overcoating layer 420, and a common electrode CE.

The second base substrate 410 may include a transparent insulation substrate. For example, the second base substrate 410 may include at least one of glass, quartz, plastic, polyethylene terephthalate resin, polyethylene resin, and polycarbonate resin, etc.

The light blocking pattern BM may be disposed on the second base substrate 410 opposing the first base substrate 210. The light blocking pattern BM may overlap a boundary of pixel areas, the thin film transistors TFT1 and TFT2, the gate lines GL1 and GL2, and the data lines DL1 and DL2. The light blocking pattern BM may define an opening portion corresponding to the pixel areas.

The color filter CF may be disposed on the second base substrate 410. The color filter CF may partially overlap the light blocking pattern BM. The color filter CF may include an organic material having a desired color. For example, the color filter CF may include a photoresist material having red, green, or blue color.

The overcoating layer 420 may cover the color filter CF and the light blocking pattern BM. The overcoating layer 420 may flatten color filter CF on the second base substrate 410, may protect the color filter CF, and may insulate the color filter CF. The overcoating layer 420 may include transparent organic material such as acrylic-epoxy material, but is not limited thereto.

The common electrode CE may be disposed on the overcoating layer 420 overlapping the color filter CF. A common voltage may be applied to the common electrode CE. The common electrode CE may include an opening pattern corresponding to the pixel area.

The common electrode CE may include the same material as the pixel electrode PE. For example, the common electrode CE may include at least one of indium zinc oxide (IZO), indium tin oxide (ITO), tin oxide (SnOx), and zinc oxide (ZnOx).

The column spacer CS1 may be disposed between the first substrate 200 and the second substrate 400. The column spacer CS1 may be disposed in an area corresponding to the thin film transistor TFT1. The column spacer CS1 may overlap the light blocking pattern BM. The column spacer CS1 may include transparent material.

The dummy patterns DP1 and DP2 may prevent differences of the column spacer CS1 that occur when the first substrate 200 and the second substrate 400 are attached to one another.

In addition, gap g1 between the dummy pattern DP1 and the source electrode SE1 may be smaller than a diameter d1 of surface of the column spacer CS1 which makes contact with the first substrate 200. For example, when the diameter d1 of the column spacer CS1 which makes contact with the first substrate 200 is 10 μm, the gap g1 between the dummy pattern DP1 and the source electrode SE1 may be less than 10 μm. In accordance with this exemplary embodiment, changing of a cell gap caused by the column spacer CS1 falling into gap g1 between the dummy pattern DP1 and the source electrode SE1 may be prevented.

Figure 3:
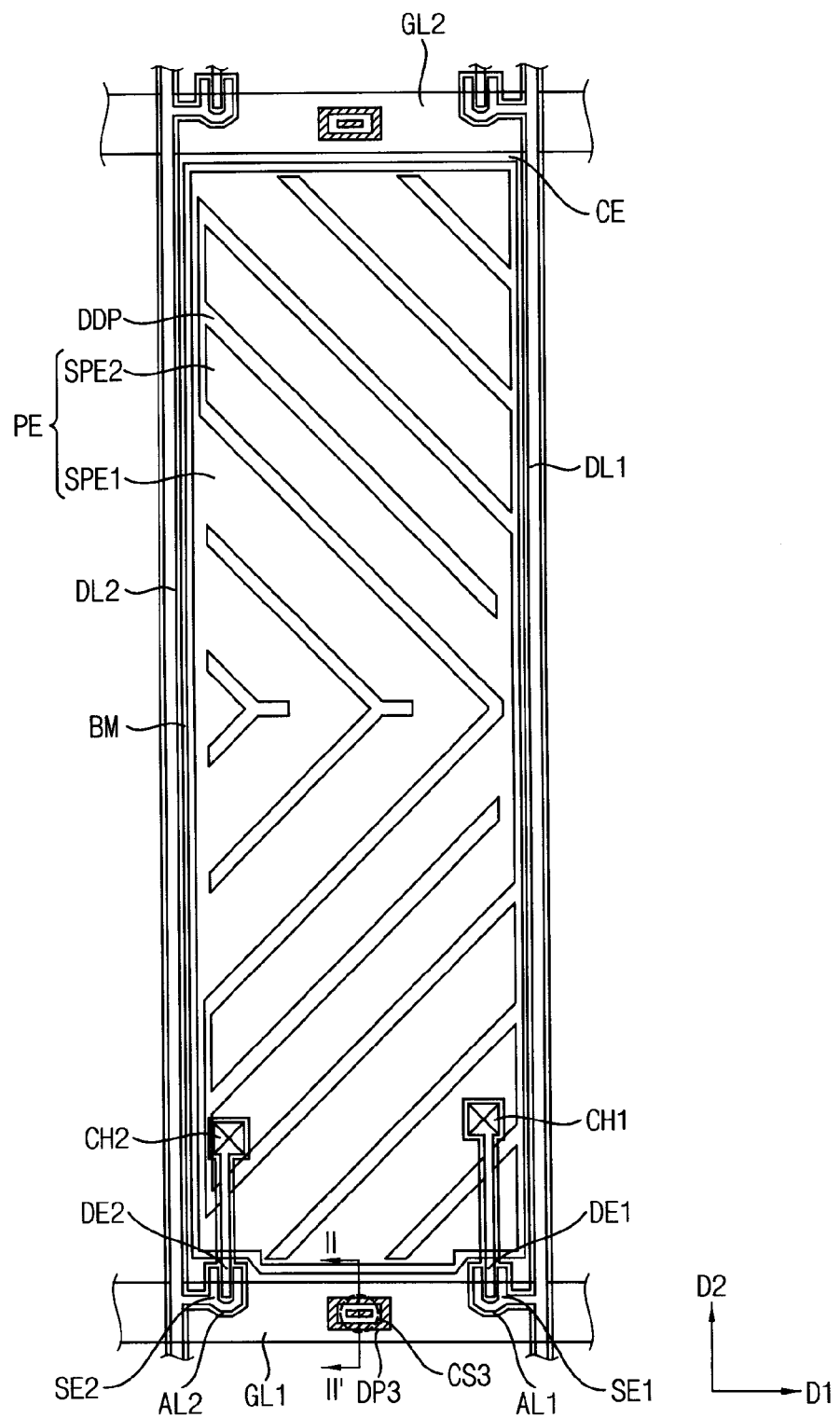
FIG. 3 is a plan view illustrating a display panel in accordance with a second exemplary embodiment of the present invention.
Figure 4:
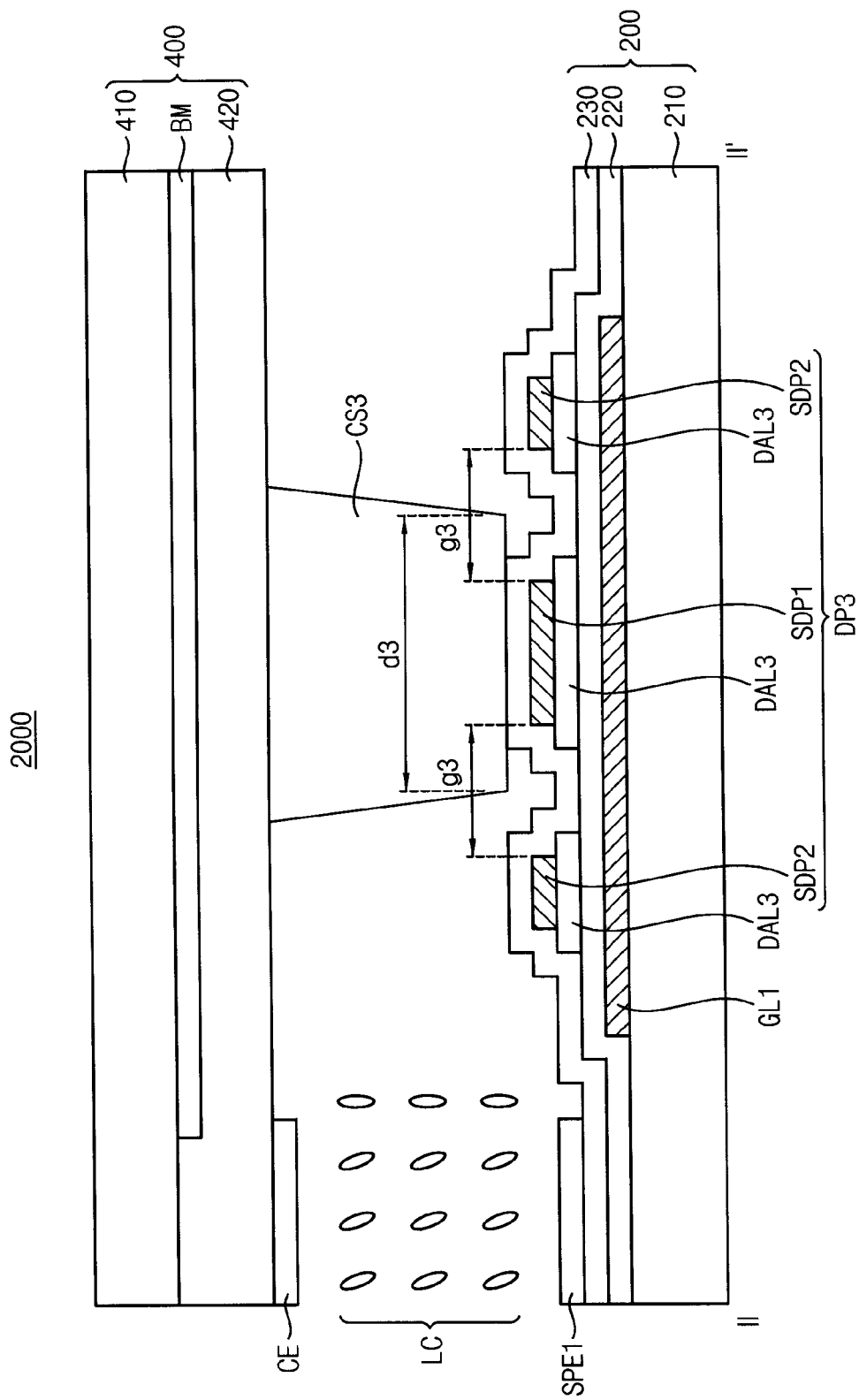
FIG. 4 is a cross-sectional view taken along the line II-II' of FIG. 3.

FIG. 3 is a plan view illustrating a display panel in accordance with a second exemplary embodiment of the invention. FIG. 4 is a cross-sectional view taken along the line II-II' of FIG. 3.

A display panel 2000 is substantially the same as the display panel 1000 illustrated in FIG. 1 except for a column spacer CS3, a dummy pattern DP3 and a dummy active layer DAL3. Thus, repeated description will be omitted.

Referring to FIGS. 3 and 4, a display panel 2000 includes a first substrate 200, a second substrate 400 facing the first substrate 200, a liquid crystal layer LC between the first substrate 200 and the second substrate 400, and a column spacer CS3 capable of maintaining a cell gap between the first substrate 200 and the second substrate 400.

In an exemplary embodiment, a dummy active layer DAL3 may be disposed on the gate insulation layer 220 overlapping the gate line GL1. Three lines of the dummy active layer DAL3 may be disposed separate from each other on the gate insulation layer 220. The dummy active layer DAL3 may be disposed in the same layer as the active layer AL1. The dummy active layer DAL3 may make contact with a portion of the dummy pattern DP3. An area of the dummy active layer DAL3 may be greater than an area of the dummy pattern DP3.

The dummy active layer DAL3 may include, for example, amorphous silicon. The active layer AL1 may include, for example, at least one of indium (In), zinc (Zn), gallium (Ga), tin (Sn), and hafnium (Hf), etc.

The dummy active layer DAL3 may include an oxide semiconductor such as, for example, indium gallium zinc oxide (IGZO), indium tin zinc oxide (ITZO), hafnium indium zinc oxide (HIZO), etc.

The dummy pattern DP3 may be disposed between the source electrode SE1 and another source electrode SE2. The dummy pattern DP3 may overlap the gate line GL1. The dummy pattern DP3 may be disposed in the same layer as the source electrodes SE1 and SE2 and the drain electrodes DE1 and DE2.

The dummy pattern DP3 may include a first sub-dummy pattern SDP1 and a second sub-dummy pattern SDP2. The first sub-dummy pattern SDP1 may have a square shape and the second sub-dummy pattern SDP2 may have a frame shape surrounding the first sub-dummy pattern SDP1.

The dummy pattern DP3 may include substantially the same material as the source electrodes SE1 and SE2 and the drain electrodes DE1 and DE2. For example, the dummy pattern DP3 may include, for example, at least one of aluminum (Al), gold (Au), silver (Ag), copper (Cu), iron (Fe), and nickel (Ni), etc.

The dummy pattern DP3 may be in an electrical floating state. A passivation layer 230 may be disposed on the source electrode SE1, the drain electrode DE1, and the dummy pattern DP3. The passivation layer 230 may cover the source electrodes SE1 and SE2, the drain electrodes DE1 and DE2, and the dummy pattern DP3. The passivation layer 230 may include substantially the same material as the gate insulation layer 220. For example, the passivation layer 230 may include at least one of silicon oxide, and silicon nitride, etc.

The column spacer CS3 may be disposed between the first substrate 200 and the second substrate 400 and may overlap the gate line GL1. The column spacer CS3 may overlap the light blocking pattern BM. The column spacer CS3 may include transparent material.

The dummy pattern DP3 may prevent differences of the column spacer CS3 that may occur when the first substrate 200 and the second substrate 400 are attached to each other.

In addition, a gap g3 between the first sub-dummy pattern SDP1 and the second sub-dummy pattern SDP2 may be smaller than a diameter d3, which measures surface of the column spacer CS3 that makes contact with the first substrate 200. For example, when the diameter d3 of the column spacer CS3 that makes contact with the first substrate 200 is 10 μm, the gap g3 between the first sub-dummy pattern SDP1 and the second sub-dummy pattern SDP2 may be less than 10 μm. According to this exemplary embodiment, the changing of a cell gap caused by the column spacer CS3 falling into a gap g3 between the first sub-dummy pattern SDP1 and the second sub-dummy pattern SDP2 may be prevented.

Figure 5:
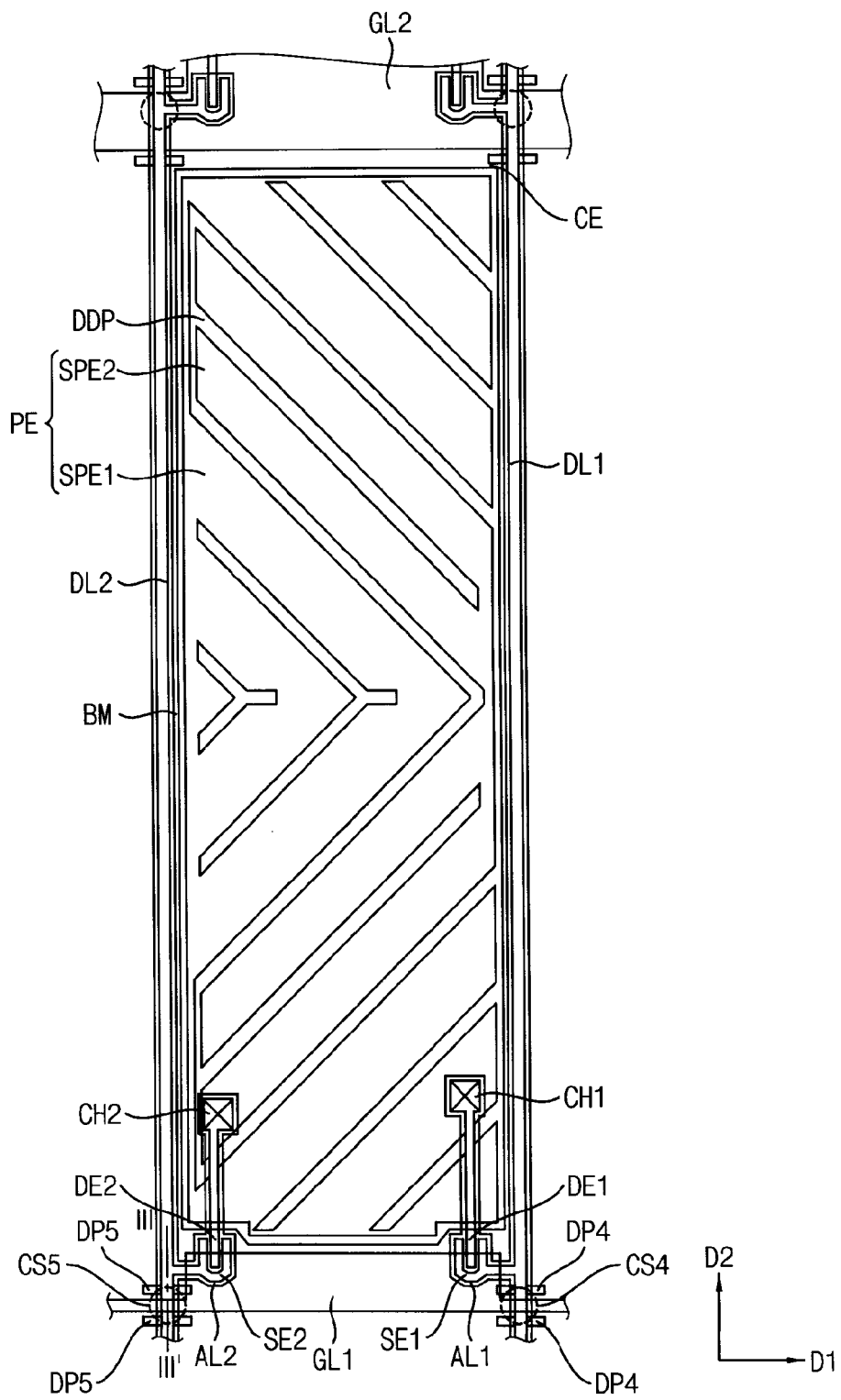
FIG. 5 is a plan view illustrating a display panel in accordance with a third exemplary embodiment of the present invention.
Figure 6:
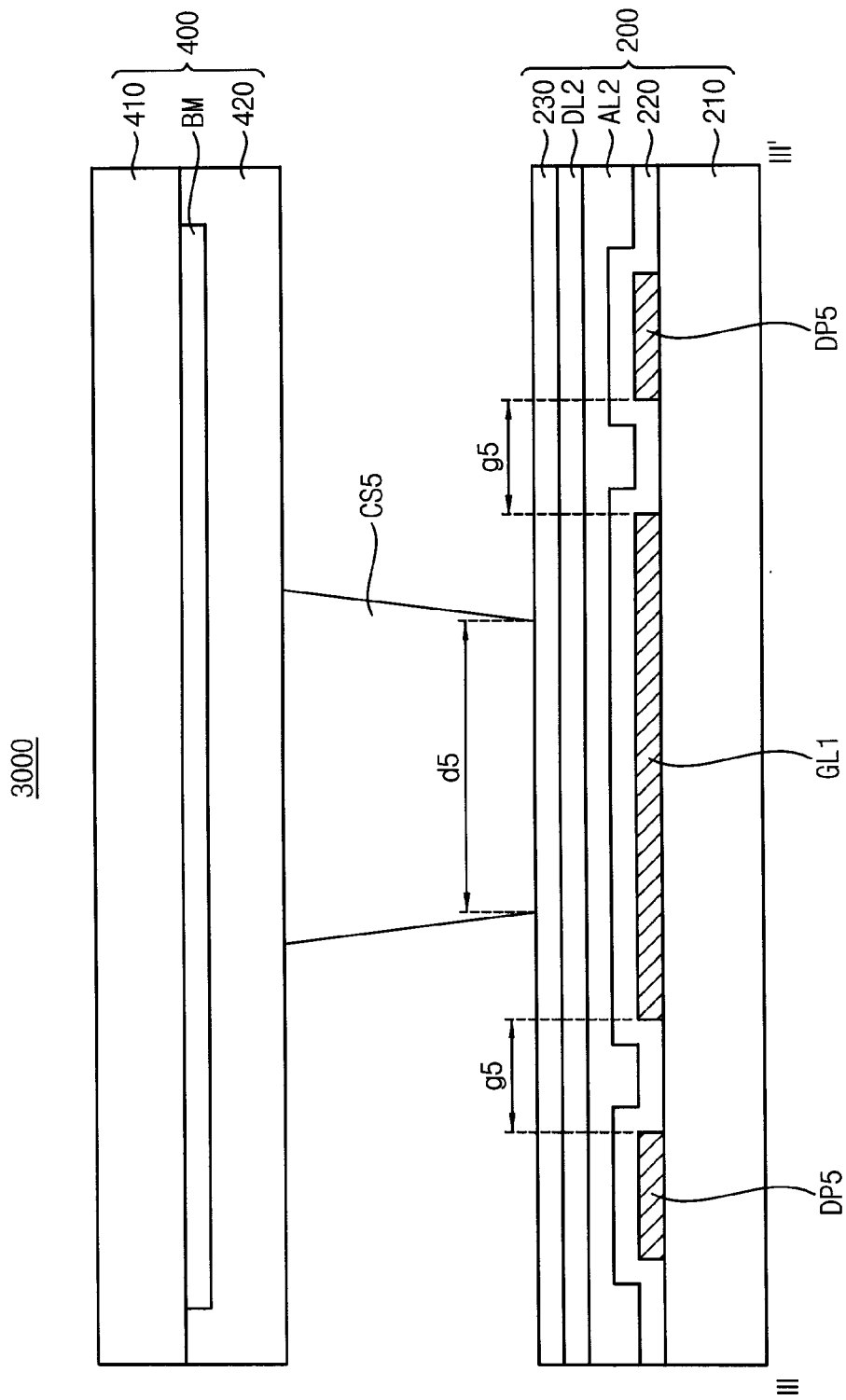
FIG. 6 is a cross-sectional view taken along the line III-III' of FIG. 5.

FIG. 5 is a plan view illustrating a display panel in accordance with a third exemplary embodiment of the invention. FIG. 6 is a cross-sectional view taken along the line III-III' of FIG. 5.

A display panel 3000 is substantially the same as the display panel 1000 illustrated in FIG. 1 except for column spacers CS4 and CS5, and dummy patterns DP4 and DP5. Thus, repeated description will be omitted.

Referring to FIGS. 5 and 6, a display panel 3000 includes a first substrate 200, a second substrate 400 facing the first substrate 200, a liquid crystal layer LC between the first substrate 200 and the second substrate 400 and a column spacer CS4, CS5 capable of maintaining a cell gap between the first substrate 200 and the second substrate 400.

The dummy pattern DP4 may be disposed to adjacent to the column spacer CS4, which is disposed in a portion of the gate line GL1 crossing with the data line DL1. The dummy pattern DP5 may be disposed to adjacent to the column spacer CS5, which is disposed in a portion of the gate line GL1 crossing with the data line DL2. The dummy patterns DP4 and DP5 may be formed on the first base substrate 210. The dummy patterns DP4 and DP5 may be spaced apart from the gate line GL1 and may be disposed in the same layer as the gate line GL1.

The dummy patterns DP4 and DP5 may be disposed in the first direction D1 and may have rectangular shape. The gate line GL1 may be disposed between the two dummy patterns DP4 and the two dummy patterns DP5.

The dummy patterns DP4 and DP5 may include substantially the same material as the gate lines GL1 and GL2. For example, the dummy patterns DP4 and DP5 may include at least one of aluminum (Al), molybdenum (Mo), chromium (Cr), tantalum (Ta), titanium (Ti), tungsten (W), copper (Cu), and silver (Ag), etc.

The dummy patterns DP4 and DP5 may be in an electrical floating state. The gate insulation layer 220 may be disposed on the first base substrate 210 covering the gate line GL1 and the dummy patterns DP4 and DP5. The gate insulation layer 220 may include a transparent insulation material such as, for example, at least one of silicon oxide, and silicon nitride, etc.

The active layer AL2 may be disposed on the gate insulation layer 220. The active layer AL2 may overlap the gate electrode GE2. The active layer AL2 may be formed, for example, of amorphous silicon. The active layer AL2 may include, for example, at least one of indium (In), zinc (Zn), gallium (Ga), tin (Sn), and hafnium (Hf), etc.

The active layer AL2 may include an oxide semiconductor such as, for example, indium gallium zinc oxide (IGZO), indium tin zinc oxide (ITZO), hafnium indium zinc oxide (HIZO), etc.

A passivation layer 230 may be disposed on the data line DL2. The passivation layer 230 may cover the source electrode SE2, the drain electrode DE2, and the data line DL2. The passivation layer 230 may include substantially the same material as the gate insulation layer 220. For example, the passivation layer 230 may include at least one of silicon oxide and silicon nitride, etc.

The column spacers CS4 and CS5 may be disposed between the first substrate 200 and the second substrate 400 and may overlap the gate line GL1. The column spacer CS4 may be disposed in a portion of the gate line GL1 crossing with the data line DL1. The column spacer CS5 may be disposed in a portion of the gate line GL1 crossing with the data line DL2. The column spacers CS4 and CS5 may overlap the light blocking pattern BM. The column spacers CS4 and CS5 may include transparent material.

The dummy patterns DP4 and DP5 may prevent differences of the column spacers CS4 and CS5 that may occur when the first substrate 200 and the second substrate 400 are attached to each other.

In addition, a gap g5 between the gate line GL1 and the dummy pattern DP5 may be may be smaller than a diameter d5, which is the distance where the surface of the column spacer CS5 makes contact with the first substrate 200. For example, when the diameter d5 of the column spacer CS5 which makes contact with the first substrate 200 is 10 μm, the gap g5 between the gate line GL1 and the dummy pattern DP5 may be less than 10 μm. In this exemplary embodiment, the changing of a cell gap caused by the column spacer CS5 falling into a gap g5 between the gate line GL1 and the dummy pattern DP5 may be prevented.

Figure 7:
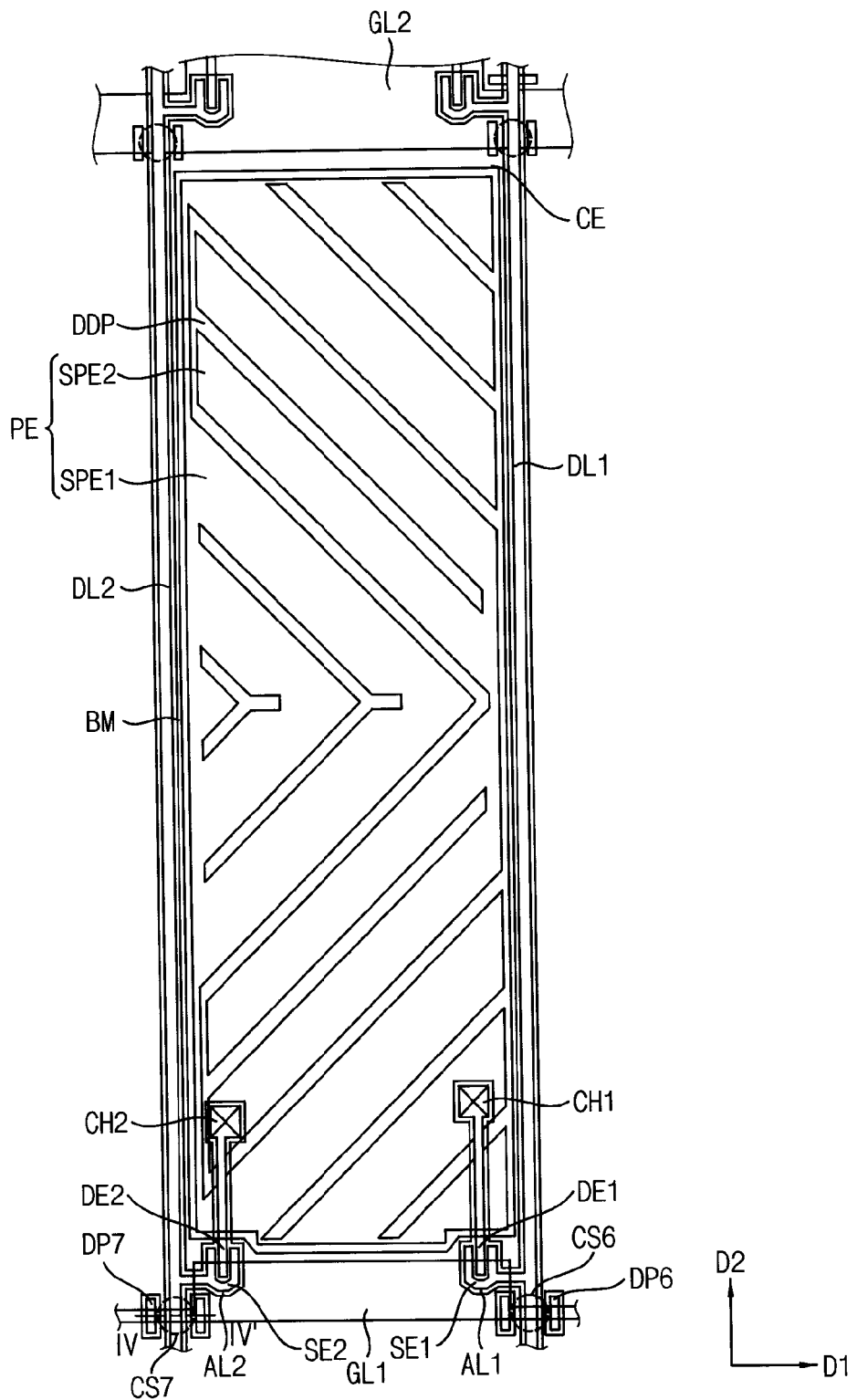
FIG. 7 is a plan view illustrating a display panel in accordance with a fourth exemplary embodiment of the present invention.
Figure 8:
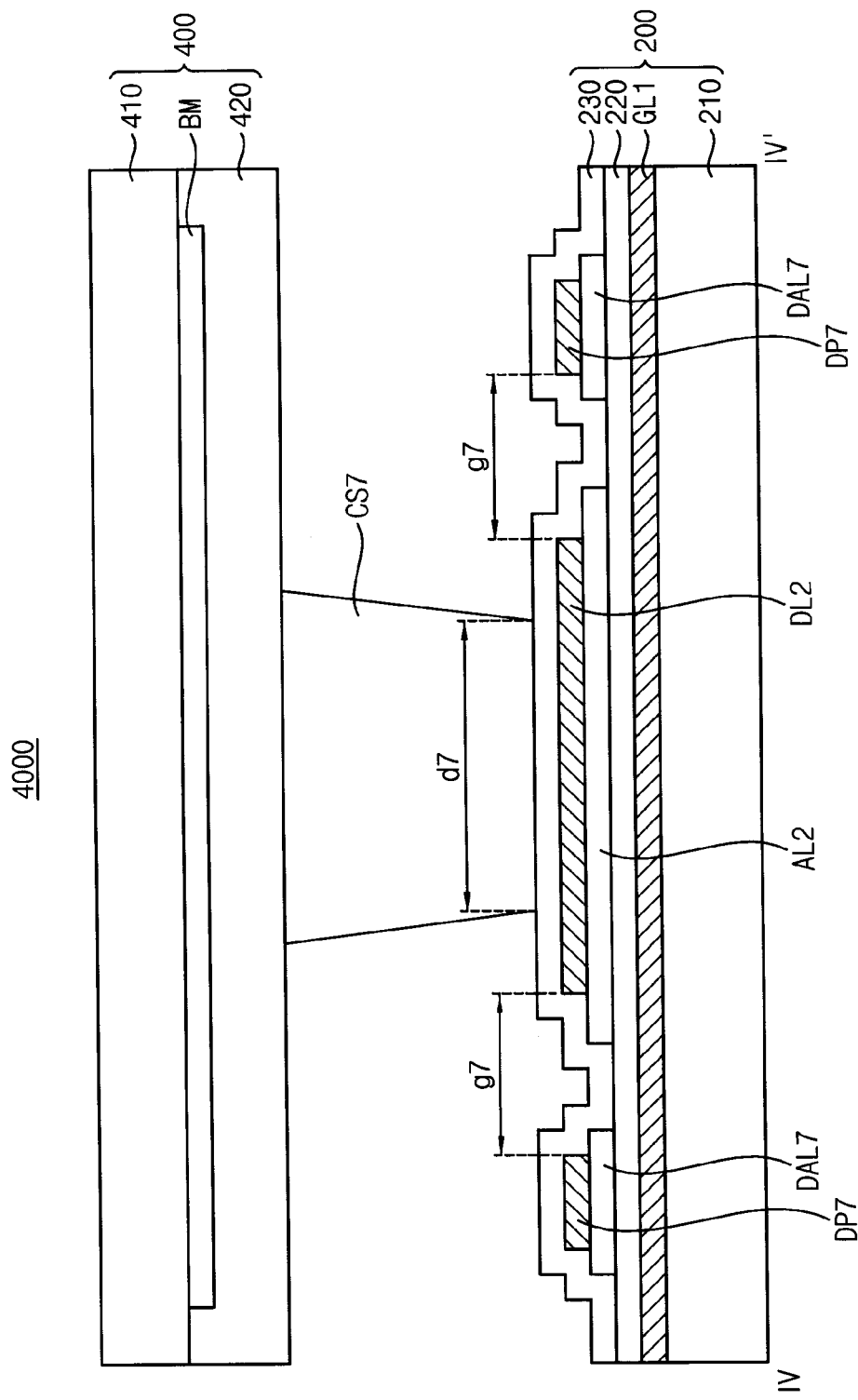
FIG. 8 is a cross-sectional view taken along the line IV-IV' of FIG. 7.

FIG. 7 is a plan view illustrating a display panel in accordance with a fourth exemplary embodiment of the invention. FIG. 8 is a cross-sectional view taken along the line IV-IV' of FIG. 7.

A display panel 4000 is substantially the same as the display panel 1000 illustrated in FIG. 1 except for column spacers CS6 and CS7, dummy patterns DP6 and DP7, and dummy active layers DAL6 and DAL7. Thus, repeated description will be omitted.

Referring to FIGS. 7 and 8, a display panel 4000 includes a first substrate 200, a second substrate 400 facing the first substrate 200, a liquid crystal layer LC between the first substrate 200 and the second substrate 400 and a column spacer CS6, CS7 capable of maintaining a cell gap between the first substrate 200 and the second substrate 400.

The gate insulation layer 220 may be disposed on the first base substrate 210 and may cover the gate line GL1. The gate insulation layer 220 may include a transparent insulation material such as, for example, at least one of silicon oxide and silicon nitride, etc.

The active layer AL2 may be disposed on the gate insulation layer 220. The active layer AL2 may overlap the gate electrode GE2. The active layer AL2 may be formed from, for example, amorphous silicon. The active layer AL2 may include, for example, at least one of indium (In), zinc (Zn), gallium (Ga), tin (Sn), and hafnium (Hf), etc.

The active layer AL2 may include an oxide semiconductor such as, for example, indium gallium zinc oxide (IGZO), indium tin zinc oxide (ITZO), hafnium indium zinc oxide (HIZO), etc.

In an exemplary embodiment of the present invention, dummy active layers DAL6 and DAL7 may be disposed overlapping the gate line GL1. The two dummy active layers DAL6 may be separated from each other. The two dummy active layers DAL6 may be disposed on the gate insulation layer 220. The dummy active layer DAL6 may be formed in the same layer as the active layer AL1. The two dummy active layers DAL7 may be disposed separate from each other. The two dummy active layers DAL7 may be disposed on the gate insulation layer 220. The dummy active layer DAL7 may be formed in the same layer as the active layer AL2. The dummy active layer DAL7 may be formed between the gate insulation layer 220 and the dummy pattern DP7. The dummy active layer DAL7 may contact a portion of the dummy pattern DP7. The upper surface area of the dummy active layer DAL7 may be greater than the area of the dummy pattern DP7.

The dummy active layers DAL6 and DAL7 may be formed, for example, from amorphous silicon. The dummy active layers DAL6 and DAL7 may include, for example, at least one of indium (In), zinc (Zn), gallium (Ga), tin (Sn), and hafnium (Hf), etc.

For example, the dummy active layers DAL6 and DAL7 may include an oxide semiconductor such as, for example, indium gallium zinc oxide (IGZO), indium tin zinc oxide (ITZO), hafnium indium zinc oxide (HIZO), etc.

The dummy pattern DP6 may be disposed adjacent to the column spacer CS6 and may be disposed in a portion of the gate line GL1 crossing with the data line DL1. The dummy pattern DP7 may be disposed adjacent to the column spacer CS7 and may be disposed in a portion of the gate line GL1 crossing with the data line DL2. The dummy patterns DP6 and DP7 may be formed on the first base substrate 210. The dummy pattern DP6 may be spaced apart from the data line DL1 and may be disposed in the same layer as the data line DL1. The dummy pattern DP7 may be spaced apart from the data line DL2 and may be disposed in the same layer as the data line DL2.

The dummy patterns DP6 and DP7 may extend in the second direction D2 and may have rectangular shape. The data line DL1 may be disposed between the two dummy patterns DP6. The data line DL2 may be disposed between the two dummy patterns DP7.

The dummy patterns DP6 and DP7 may include substantially the same material as the data lines DL1 and DL2. For example, the dummy pattern DP6, DP7 may include at least one of aluminum (Al), molybdenum (Mo), chromium (Cr), tantalum (Ta), titanium (Ti), tungsten (W), copper (Cu), and silver (Ag), etc.

The dummy pattern DP6, DP7 may be in an electrical floating state. A passivation layer 230 may be disposed on the data lines DL1 and DL2 and the dummy patterns DP6 and DP7. The passivation layer 230 may cover the data lines DL1 and DL2 and the dummy patterns DP6 and DP7. The passivation layer 230 may include substantially the same material as the gate insulation layer 220. For example, the passivation layer 230 may include at least one of silicon oxide and silicon nitride, etc.

The column spacers CS6 and CS7 may be disposed between the first substrate 200 and the second substrate 400 and may overlap with the gate line GL1. The column spacer CS6 may be disposed in a portion of the gate line GL1 crossing with the data line DL1. The column spacer CS7 may be disposed in a portion of the gate line GL1 crossing with the data line DL2. The column spacers CS6 and CS7 may overlap the light blocking pattern BM. The column spacers CS6 and CS7 may include transparent material.

The dummy patterns DP6 and DP7 serve to prevent difference of the column spacers CS6 and CS7 that may occur when the first substrate 200 and the second substrate 400 are attached to each other.

In addition, a gap g7 between the data line DL2 and the dummy pattern DP7 may be may be smaller than a diameter d7, the distance in which the surface of the column spacer CS7 makes contact with the first substrate 200. For example, when the diameter d7 of the column spacer CS7 which contacts the first substrate 200 is 10 μm, the gap g7 between the data line DL2 and the dummy pattern DP7 may be less than 10 μm. Thus, according to the current embodiment, the changing of a cell gap that may occur from the column spacer CS7 falling into a gap g7 between the data line DL2 and the dummy pattern DP7 may be prevented.

Figure 9:
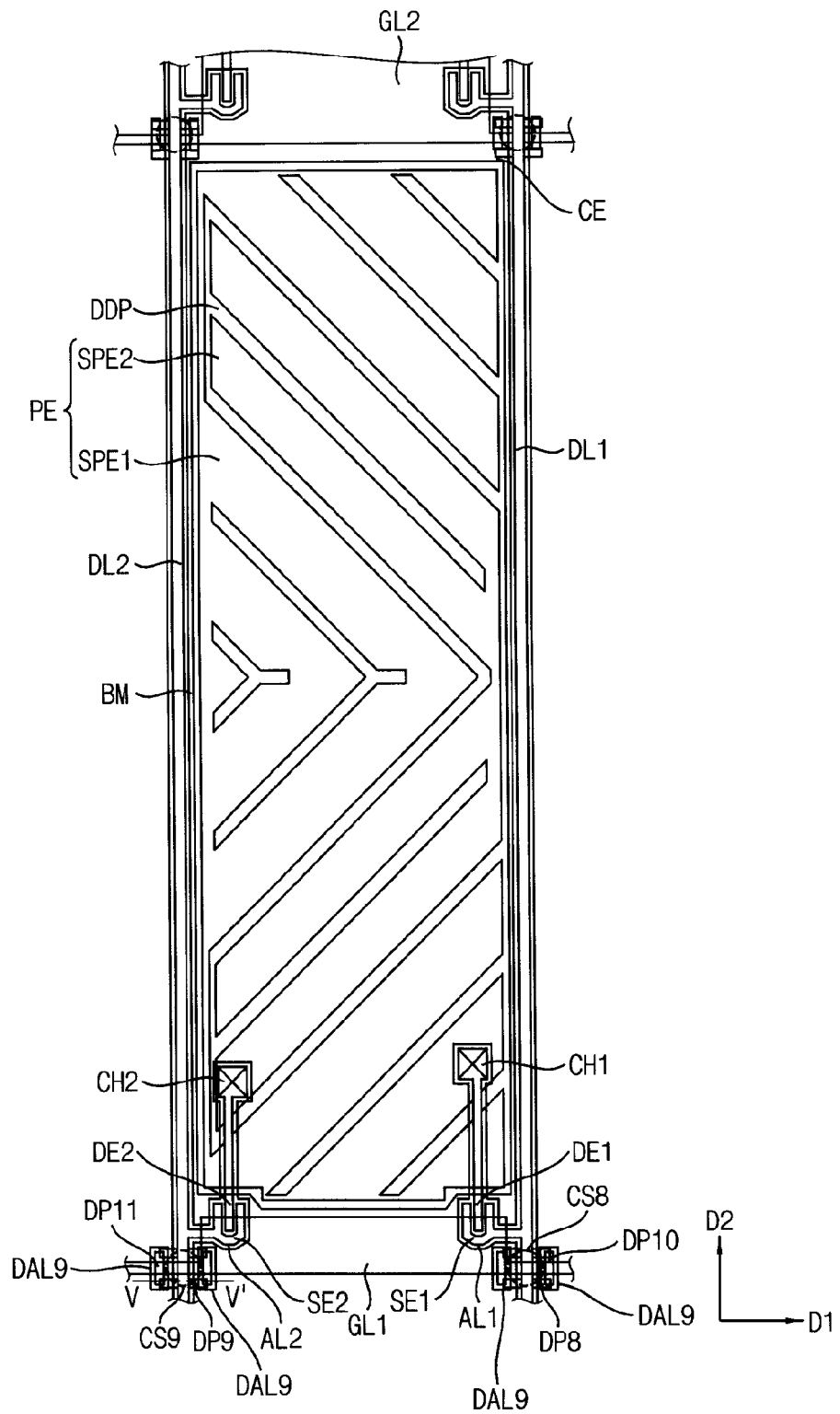
FIG. 9 is a plan view illustrating a display panel in accordance with a fifth exemplary embodiment of the present invention.
Figure 10:
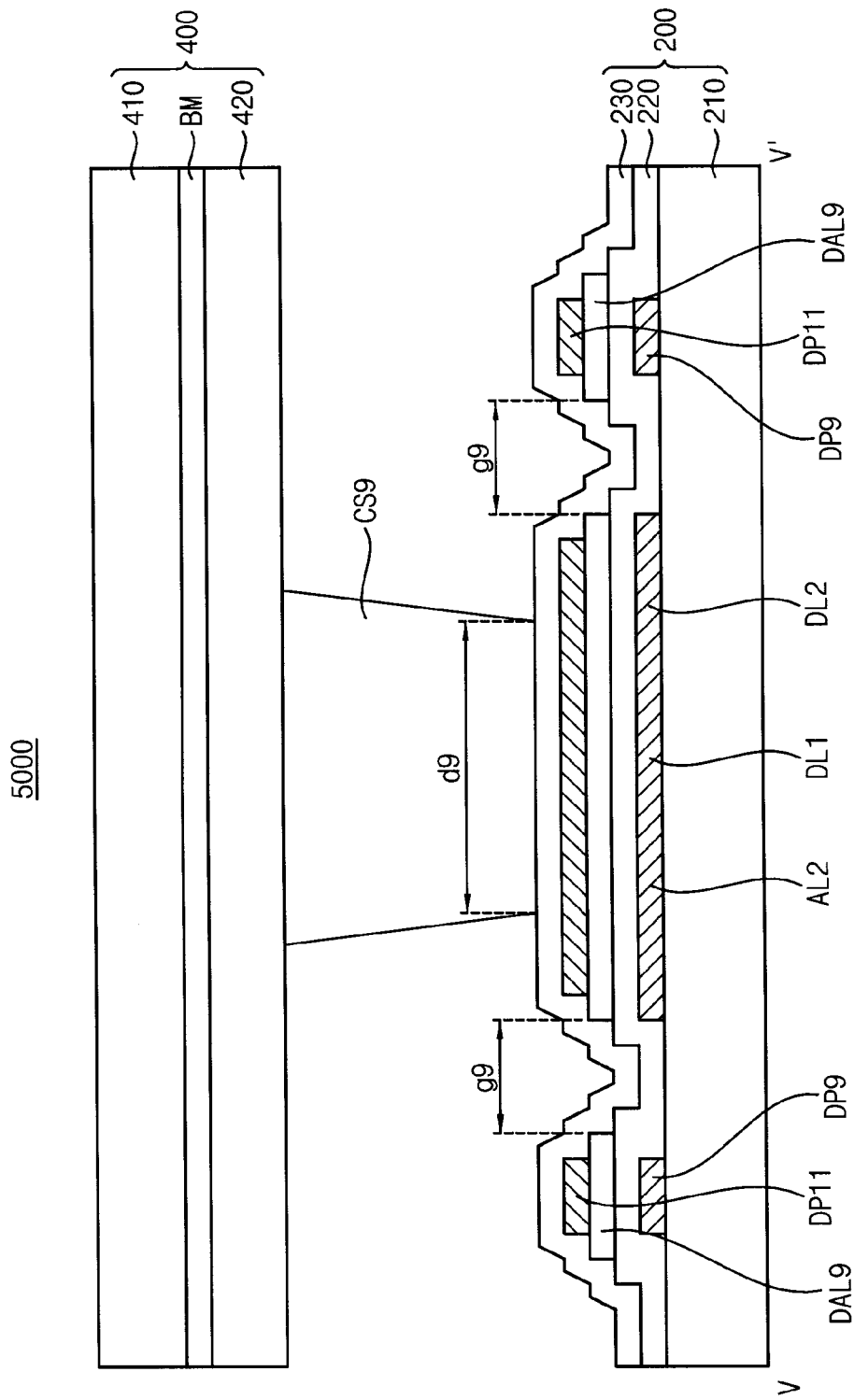
FIG. 10 is a cross-sectional view taken along the line V-V' of FIG. 9.

FIG. 9 is a plan view illustrating a display panel in accordance with a fifth exemplary embodiment of the invention. FIG. 10 is a cross-sectional view taken along the line V-V' of FIG. 9.

A display panel 5000 is substantially the same as the display panel 1000 illustrated in FIG. 1 except for column spacers CS8 and CS9, dummy patterns DP8, DP9, DP10, and DP11, and dummy active layers DAL8 and DAL9. Thus, repeated description will be omitted.

Referring to FIGS. 9 and 10, a display panel 5000 includes a first substrate 200, a second substrate 400 facing the first substrate 200, a liquid crystal layer LC between the first substrate 200 and the second substrate 400, and column spacers CS8 and CS9 capable of maintaining a cell gap between the first substrate 200 and the second substrate 400.

The dummy pattern DP8 may be disposed adjacent to the column spacer CS8, and may be disposed in a portion of the gate line GL1 crossing with the data line DL1. The dummy pattern DP9 may be disposed adjacent to the column spacer CS9 and may be disposed in a portion of the gate line GL1 and the data line DL2. The dummy patterns DP8 and DP9 may be formed on the first base substrate 210. The dummy patterns DP8 and DP9 may be spaced apart from the gate line GL1 and may be disposed in the same layer as the gate line GL1.

The dummy patterns DP8 and DP9 may extend in the first direction D1 and may have rectangular shapes. The gate line GL1 may be disposed between the two dummy patterns DP8 and the two dummy patterns DP9.

The dummy patterns DP8 and DP9 may include substantially the same material as the gate lines GL1 and GL2. For example, the dummy patterns DP8 and DP9 may include at least one of aluminum (Al), molybdenum (Mo), chromium (Cr), tantalum (Ta), titanium (Ti), tungsten (W), copper (Cu), and silver (Ag), etc.

The dummy patterns DP8 and DP9 may be in an electrical floating state. The gate insulation layer 220 may be disposed on the first base substrate 210 and may cover the gate line GL1 and the dummy patterns DP8 and DP9. The gate insulation layer 220 may include a transparent insulation material such as, for example, at least one of silicon oxide and silicon nitride, etc.

The active layers AL1 and AL2 may be disposed on the gate insulation layer 220. The active layers AL1 and AL2 may overlap the gate electrodes GE1 and GE2, respectively. The active layers AL1 and AL2 may be formed from, for example, amorphous silicon. The active layer AL1 and AL2 may include, for example, at least one of indium (In), zinc (Zn), gallium (Ga), tin (Sn), and hafnium (Hf), etc.

The active layers AL1 and AL2 may include an oxide semiconductor such as, for example, indium gallium zinc oxide (IGZO), indium tin zinc oxide (ITZO), hafnium indium zinc oxide (HIZO), etc.

A dummy active layers DAL8 and DAL9 may be disposed overlapping the dummy patterns DP8 and DP9, respectively.

In an exemplary embodiment of the present invention, dummy active layers DAL8 and DAL9 may be disposed to overlap dummy patterns DP8 and DP9, respectively. The two dummy active layers DAL8 may be disposed separate from each other. The two dummy active layers DAL8 may be disposed on the gate insulation layer 220. The dummy active layer DAL8 may be formed in the same layer as the active layer AL1. The two dummy active layers DAL9 may be disposed separate from each other. The two dummy active layers DAL9 may be disposed on the gate insulation layer 220. The dummy active layer DAL9 may be formed in the same layer as the active layer AL2.

The dummy active layer DAL8 may be formed between the dummy pattern DP8 and the dummy pattern DP10. The dummy active layer DAL8 may make contact with a portion of the dummy pattern DP10. The upper surface of area of the dummy active layer DAL8 may be greater than the upper surface area of the dummy pattern DP10.

The dummy active layer DAL9 may be formed between the dummy pattern DP9 and the dummy pattern DP11. The dummy active layer DAL9 may contact a portion of the dummy pattern DP11. The upper surface area of the dummy active layer DAL9 may be greater than the upper surface area of the dummy pattern DP11.

The dummy active layers DAL8 and DAL9 may be formed from, for example, amorphous silicon. The dummy active layers DAL8 and DAL9 may include, for example, at least one of indium (In), zinc (Zn), gallium (Ga), tin (Sn), and hafnium (Hf), etc.

For example, the dummy active layers DAL8 and DAL9 may include an oxide semiconductor such as, for example, indium gallium zinc oxide (IGZO), indium tin zinc oxide (ITZO), hafnium indium zinc oxide (HIZO), etc.

The dummy pattern DP10 may be disposed to adjacent to the column spacer CS8 and may be disposed in a portion of the gate line GL1 crossing with the data line DL1. The dummy pattern DP11 may be disposed to adjacent to the column spacer CS9, and may be disposed in a portion of the gate line GL1 that crosses the data line DL2. The dummy pattern DP10 may be disposed on the dummy active layer DAL8. The dummy pattern DP11 may be disposed on the dummy active layer DAL9. The dummy pattern DP10 may be spaced apart from the data line DL1 and may be disposed in the same layer as the data line DL1. The dummy pattern DP11 may be spaced apart from the data line DL2 and may be disposed in the same layer as the data line DL2.

The dummy patterns DP10 and DP11 may extend in the second direction D2 and may have rectangular shape. The data line DL1 may be disposed between the two dummy patterns DP10. The data line DL2 may be disposed between the two dummy patterns DP11.

The dummy patterns DP10 and DP11 may include substantially the same material as the data lines DL1 and DL2. The dummy patterns DP10 and DP11 may include, for example, at least one of aluminum (Al), molybdenum (Mo), chromium (Cr), tantalum (Ta), titanium (Ti), tungsten (W), copper (Cu), and silver (Ag), etc.

The dummy patterns DP10 and DP11 may be in an electrical floating state. The dummy patterns DP8 and DP10 may create a cross-shape with each other in a plan view. The dummy patterns DP9 and DP11 may collectively make a cross shape when viewed in plan view.

A passivation layer 230 may be disposed on the data lines DL1 and DL2 and the dummy patterns DP10 and DP11. The passivation layer 230 may cover the data lines DL1 and DL2 and the dummy patterns DP10 and DP11. The passivation layer 230 may include substantially the same material as the gate insulation layer 220. For example, the passivation layer 230 may include at least one of silicon oxide and silicon nitride, etc.

The column spacers CS8 and CS9 may be disposed between the first substrate 200 and the second substrate 400 and may overlap the gate line GL1. The column spacer CS8 may be disposed in a portion of the gate line GL1 crossing with the data line DL1. The column spacer CS9 may be disposed in a portion of the gate line GL1 crossing with the data line DL2. The column spacers CS8 and CS9 may overlap the light blocking pattern BM. The column spacers CS8 and CS9 may include transparent material.

The dummy patterns DP8, DP9, DP10, and DP11 may prevent differences of the column spacers CS8 and CS9 that may occur when the first substrate 200 and the second substrate 400 are attached to each other.

In addition, a gap g9 between the data line DL2 and the dummy pattern DP9 or the dummy pattern DP11 may be may be smaller than a diameter d9, which is the distance where the surface of the column spacer CS9 that makes contact with the first substrate 200. For example, when the diameter d9 of the column spacer CS9 which makes contact with the first substrate 200 is 10 µm, the gap g9 between the data line DL2 and the dummy pattern DP9 or the dummy pattern DP11 may be less than 10 µm. Thus, according to this exemplary embodiment of the present invention, changing of a cell gap that may result from the column spacer CS9 falling into a gap g9 between the data line DL2 and the dummy pattern DP9 or the dummy pattern DP11 may be prevented.

FIGS. 11 to 19 are cross-sectional views illustrating an exemplary embodiment of a method of manufacturing a display panel according to the present invention.

Figure 11:
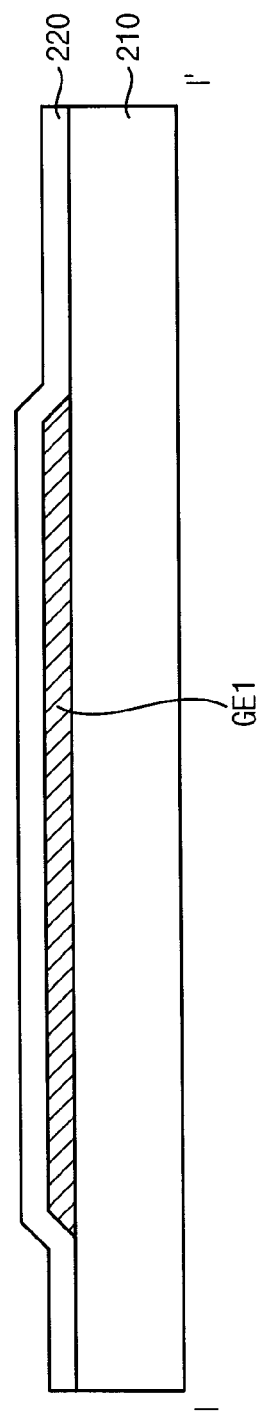

Referring to FIG. 11, a gate metal layer may be formed on a first base substrate 210. The gate metal layer may be patterned to form a gate metal pattern including a gate electrode GE1 and a gate line GL1 (not shown).

The first base substrate 210 may include a transparent insulation substrate. For example, the first base substrate 210 may include at least one of glass, quartz, plastic, polyethylene terephthalate resin, polyethylene resin, and polycarbonate resin, etc.

The gate metal layer may include copper layer. An upper or lower portion of the copper layer of the gate line GL1 may include at least one of copper oxide (CuOx), gallium doped zinc oxide (GZO), indium doped zinc oxide (IZO), and an alloy of copper and manganese (CuMn).

A gate insulation layer 220 may be formed on the first base substrate 210 and the gate metal pattern. The gate insulation layer 220 may include a transparent insulation material such as, for example, at least one of silicon oxide and silicon nitride, etc. The gate insulation layer may be formed by chemical vapor deposition process or organic layer coating process.

Figure 12:
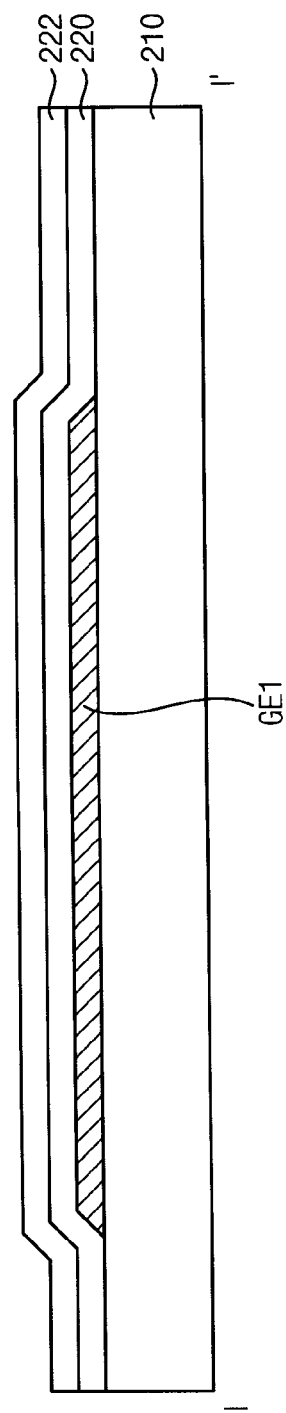
Figure 13:
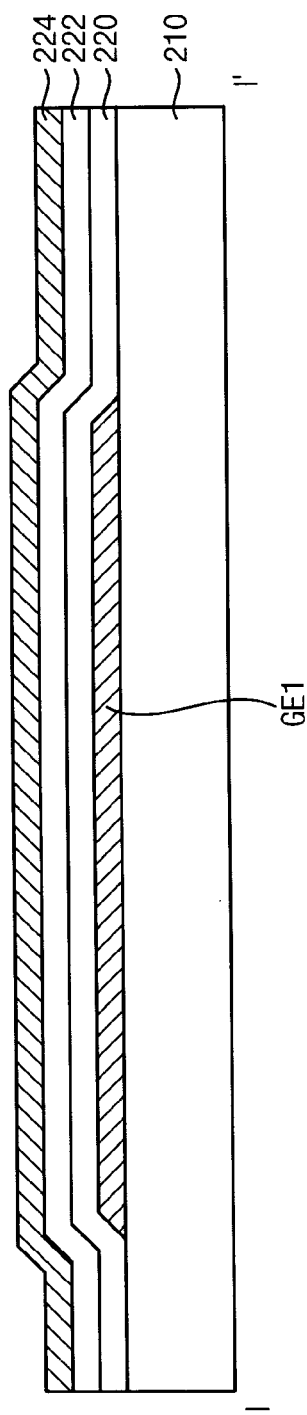

Referring to FIGS. 12 and 13, an active layer 222 may be formed on the first base substrate 210 on the gate insulation layer 220. A signal metal layer 224 may be formed on the first base substrate 210 on the active layer 222. The signal metal layer 224 may include, for example, at least one of aluminum (Al), gold (Au), silver (Ag), copper (Cu), iron (Fe), and nickel (Ni), etc.

A photoresist layer is provided on the first base substrate 210 where the signal metal layer 224 is formed. The photoresist layer may include, for example, positive-type photoresist composition in which an area illuminated by light is removed by developer and an area non-illuminated by the light is hardened to remain. In an exemplary embodiment, the photoresist layer may be provided on the signal metal layer 224 by spin-coating process or slit-coating process.

The photoresist layer may be selectively exposed using a half-toned mask on the first base substrate 210 where the photoresist layer may be formed. The half-toned mask may include a nontransparent part, a half-transmittance part, and a transmittance part, according to light transmittance. The nontransparent part may not transmit wavelengths used in the expose process of the photoresist layer. The transmittance part may transmit wavelengths used in the expose process of the photoresist layer. The half-transmittance part may have light transmittance in a range between the light transmittance of the nontransparent and the transmittance parts.

Then, the photoresist layer may be irradiated using a light source after the half-toned mask. The photoresist layer may be cured according to exposed the photoresist layer.

Then, the positive photoresist material that is not to be cured by the light source, may be removed using developer. Thus, a photoresist pattern may be formed on the signal metal layer 224 by the developing process.

The photoresist pattern may be used as an etching mask to partially remove the signal metal layer 224. A portion of the photoresist pattern corresponding to area of an active pattern AL1 illustrated in FIG. 16 may have different thickness, such that the portion may not be removed.

Figure 14:
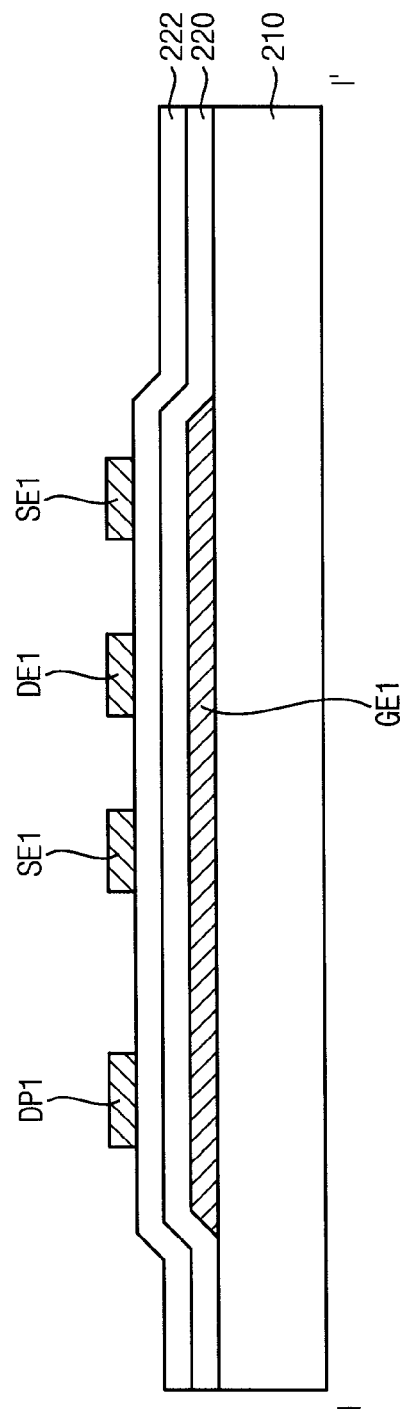

Referring to FIG. 14, the signal metal layer 224 may be etched to form a source metal pattern. The source metal pattern may include a data line DL1 (not shown) crossing with the gate line GL1, a source electrode SE1, a drain electrode DE1, and a dummy pattern DP1. The data line DL1, the source electrode SE1, the drain electrode DE1, and the dummy pattern DP1 may be formed in the same layer at the same time. An etching process of the signal metal layer 224 may include dry etch or wet etch.

The source electrode SE1 may protrude from the data line DL1 in the first direction D1. The source electrode SE1 may have a U-shape.

The drain electrode DE1 may be spaced apart from the source electrode SE1. The drain electrode DE1 may be disposed in the same layer as the source electrode SE1. The drain electrode DE1 may be disposed in a middle of the source electrode SE1 having a U-shape. Thus, the drain electrode DE1 may overlap an active pattern AL1 and may extend along the data line DL1.

The drain electrode DE1 may include substantially the same material as the source electrode SE1. For example, the source electrode SE1 and the drain electrode DE1 may include at least one of aluminum (Al), gold (Au), silver (Ag), copper (Cu), iron (Fe), and nickel (Ni), etc.

The dummy pattern DP1 may be separated from the source electrode SE1. The dummy pattern DP1 may be formed in the same layer as the drain electrode DE1. The dummy pattern DP1 may overlap the gate electrode GE1. For example, the dummy pattern DP1 may have an arc-shape partially surrounding the source electrode SE1.

The dummy pattern DP1 may include substantially the same material as the source electrode SE1 and the drain electrode DE1. For example, the dummy pattern DP1 may include at least one of aluminum (Al), gold (Au), silver (Ag), copper (Cu), iron (Fe), and nickel (Ni), etc.

In another exemplary embodiment, the dummy pattern DP1 may be formed in the same layer and at the same time as the gate line GL1 and may overlap the data line DL1.

In another example embodiment, the dummy pattern DP1 may be formed in the same layer and at the same time as the data line DL1. The dummy pattern DP1 and a dummy pattern DP2 overlapping the data line DL1 may be formed at the same time.

The photoresist pattern may be removed to form a secondary photoresist pattern. In an exemplary embodiment, the photoresist pattern may be formed by etch back process or another suitable process. A thinner portion of the photoresist pattern may be entirely removed. A thicker portion of the photoresist pattern may be only partially removed to form the secondary photoresist pattern.

Figure 15:
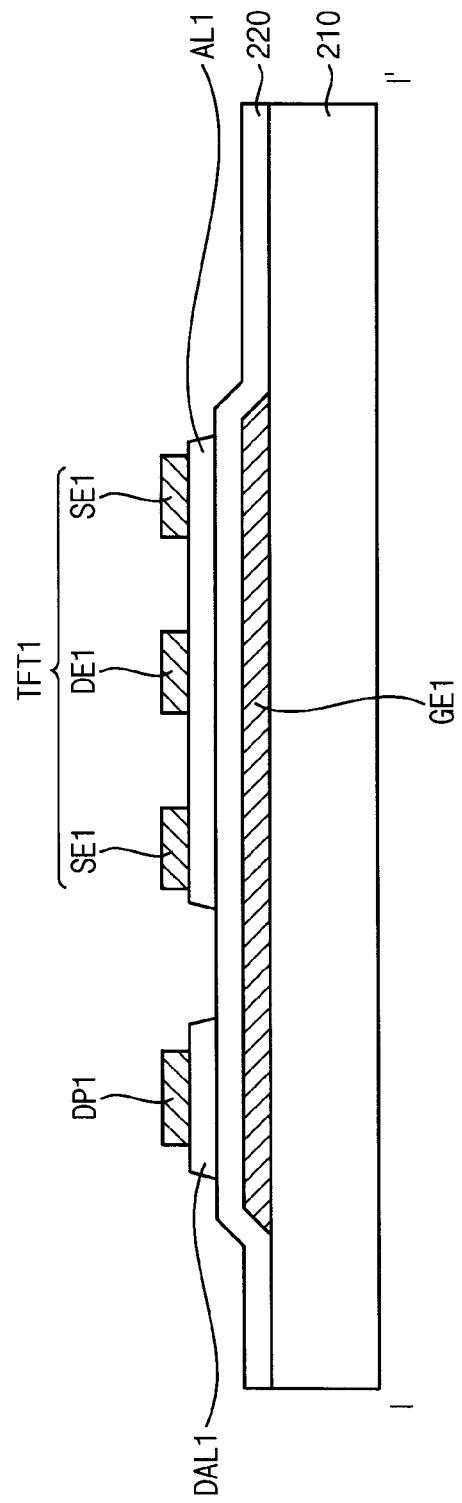

Referring to FIG. 15, the secondary photoresist pattern may be used as an etching mask to partially remove the active layer 222, forming an active pattern AL1 and a dummy active layer DAL1. Thus, a thin film transistor TFT1 including the gate electrode GE1, the gate insulation layer 220, the active layer AL1, the source electrode SE1, and the drain electrode DE1 may be formed.

The active pattern AL1 may overlap the gate electrode GE1. The active pattern AL1 may make contact with the source electrode SE1 and the drain electrode DE1.

The dummy active layer DAL1 may overlap the gate electrode GE1. The dummy active layer DAL1 may be formed in the same layer as the active pattern AL1. The dummy active layer DAL1 may make contact with a portion of the dummy pattern DP1. An upper surface area of the dummy active layer DAL1 may be greater than an upper surface area of the dummy pattern DP1.

The dummy active layer DAL1 and the active pattern AL1 may include, for example, amorphous silicon. The dummy active layer DAL1 and the active pattern AL1 may include, for example, indium (In), zinc (Zn), gallium (Ga), tin (Sn), and hafnium (Hf), etc.

The dummy active layer DAL1 and the active pattern AL1 may include an oxide semiconductor such as, for example, indium gallium zinc oxide (IGZO), indium tin zinc oxide (ITZO), or hafnium indium zinc oxide (HIZO), etc.

The percent of the active pattern AL1 etched may be controlled in the etching process. Thus, the source metal pattern, the active pattern AL1, the dummy pattern DP1, and the dummy active pattern DAL1 may be patterned using one mask, such that forming the thin film transistor TFT1 may be simplified.

Then, an ashing process or a strip process may be used to remove the remained photoresist patter.

Figure 16:
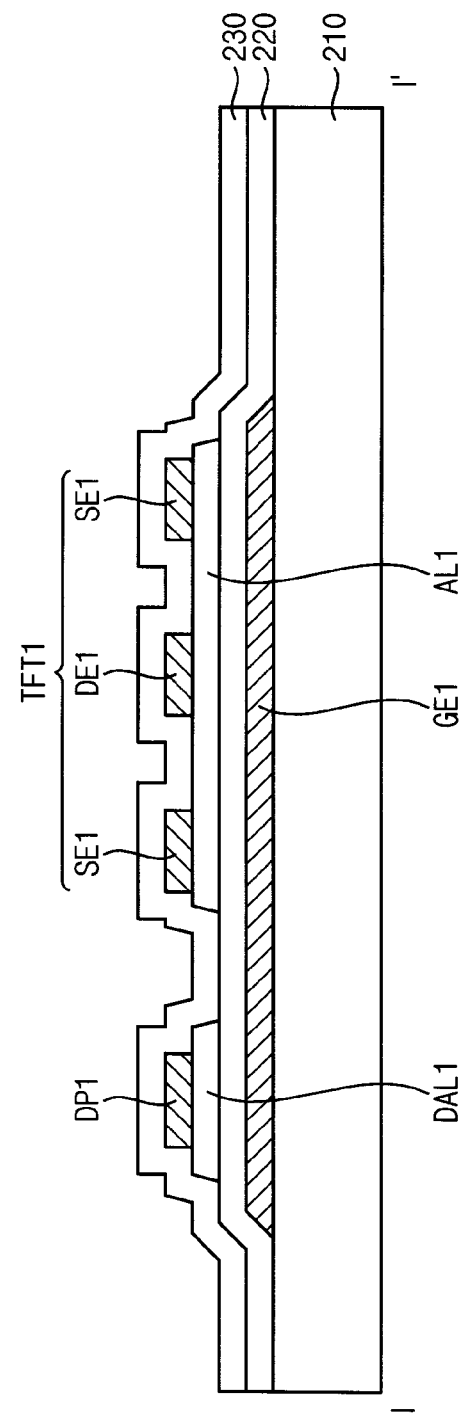
Figure 17:
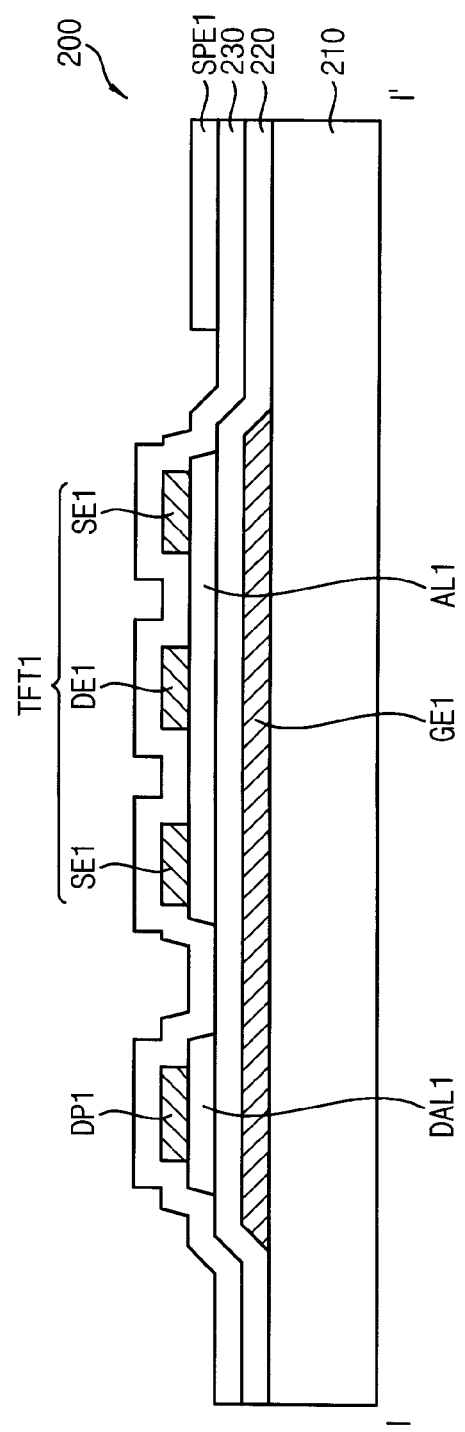

Referring to FIGS. 16 and 17, a passivation layer 230 may be formed on the first base substrate 210 on the source metal pattern. The passivation layer 230 may be formed by a deposition process using silicon hydride and ammonia gas ($NH_3$). For example, the passivation layer 230 may be formed by a chemical vapor deposition process (CVD) of hydride ($H_2$).

A contact hole CH1 may be formed on the first base substrate 210 in the passivation layer 230. The contact hole CH1 may be formed through the passivation layer 230 in an area corresponding to the drain electrode DE1.

A pixel electrode PE may be formed to contact the drain electrode DE1 through the contact hole CH1. The pixel electrode PE may include transparent conductive material. The pixel electrode PE may include, for example, indium zinc oxide (IZO), indium tin oxide (ITO), tin oxide (SnOx) or zinc oxide (ZnOx). The pixel electrode PE may include an opaque metal having a low reflectivity such as, for example, at least one of aluminum (Al), platinum (Pt), silver (Ag), gold (Au), chromium (Cr), tungsten (W), molybdenum (Mo), titanium (Ti), and their oxides, etc. Thus, a first substrate 200 may be formed.

Figure 18:
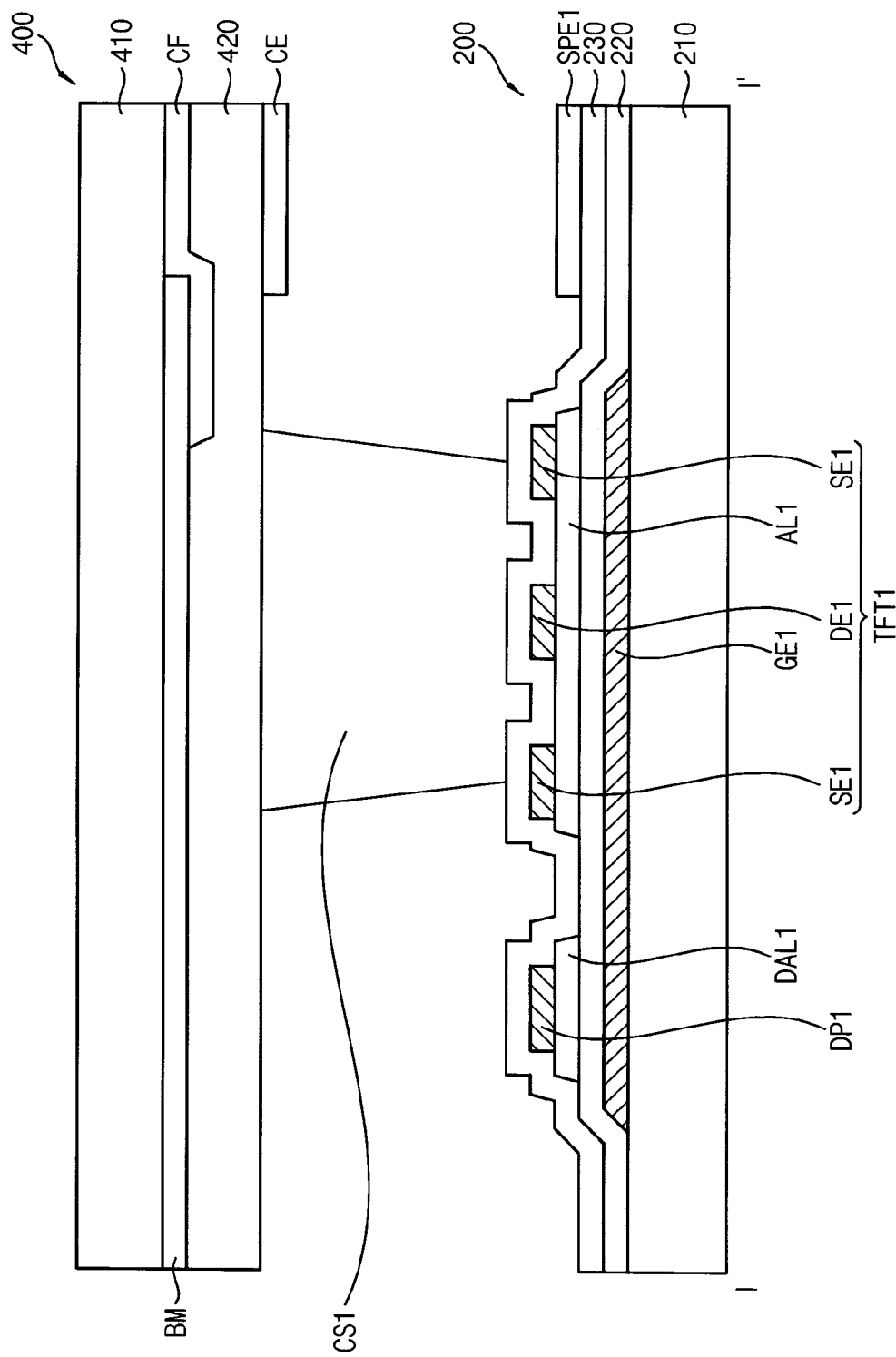

Referring to FIG. 18, a second base substrate 410 opposing the first base substrate 210 may be formed. The second base substrate 410 may include a transparent insulation substrate. For example, the second base substrate 410 may include at least one of glass, quartz, plastic, polyethylene terephthalate resin, polyethylene resin, and polycarbonate resin, etc.

A light blocking pattern BM may be formed on the second base substrate 410 opposing to the first base substrate 210. The light blocking pattern BM may define an opening portion corresponding to the pixel areas.

A color filter CF may be formed on the second base substrate 410. The color filter CF may partially overlap the light blocking pattern BM. The color filter CF may include a colored organic material. For example, the color filter CF may include a photoresist material having red, green, or blue color.

An overcoating layer 420 may be formed on the color filter CF and the light blocking pattern BM. The overcoating layer 420 may cover the color filter CF and the light blocking pattern BM. The overcoating layer 420 may flatten color filter CF on the second base substrate 410, may protect the color filter CF, and may insulate the color filter CF. The overcoating layer 420 may include transparent organic material such as acrylic-epoxy material.

A common electrode CE may be formed on the overcoating layer 420 and may overlap the color filter CF. A common voltage may be applied to the common electrode CE. An opening pattern of the common electrode CE may be formed corresponding to the pixel area. The common electrode CE may include the same material as the pixel electrode PE. For example, the common electrode CE may include at least one of indium zinc oxide (IZO), indium tin oxide (ITO), tin oxide (SnOx), and zinc oxide (ZnOx). Thus, a second substrate 400 may be formed.

A column spacer CS1 may be provided to maintain a cell gap between the first substrate 200 and the second substrate 400. A column spacer CS1 may be provided between the first substrate 200 and the second substrate 400. The column spacer CS1 may be provided in an area corresponding to the thin film transistor TFT1. The column spacer CS1 may overlap the gate line GL1. The column spacer CS1 may include a transparent material.

Referring to FIG. 19, a liquid crystal layer LC may be formed between the first substrate 200 and the second substrate 400. The liquid crystal layer LC may have an arrangement of liquid crystal molecules controlled by an electrical field, such that light transmittance may be controlled.

The dummy pattern DP1 serves to prevent a difference of the column spacer CS1 that may occur when the first substrate 200 and the second substrate 400 are attached to each other.

In addition, a gap g1 between the dummy pattern DP1 and the source electrode SE1 may be smaller than a diameter d1, which is the distance of surface of the column spacer CS1 that makes contact with the first substrate 200. For example, when the diameter d1 of the column spacer CS1 which makes contact with the first substrate 200 is 10 μm, the gap g1 between the dummy pattern DP1 and the source electrode SE1 may be less than 10 μm. In this manner, the changing of a cell gap that may occur when the column spacer CS1 falls into a gap g1 between the dummy pattern DP1 and the source electrode SE1 may be prevented. Thus, a display panel 1000 may be formed.

According to the exemplary embodiments of the invention, a dummy pattern adjacent to a column spacer may be formed to prevent a difference of cell gap of a display panel by the column spacer, and a changing of the cell gap between a first substrate and a second substrate. Thus, display characteristic may be improved to remove display imbalances caused by changing of cell gap.

Furthermore, a dummy pattern may be formed in the same layer as a source electrode, a gate electrode or a data line, reducing manufacturing costs associated with forming the dummy pattern.

The foregoing is illustrative of the invention and is not to be construed as limiting thereof. Although a few example embodiments of the invention have been described, those skilled in the art will readily appreciate that many modifications are possible in the example embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific example embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. A display panel, comprising:
   a first substrate;
   a second substrate facing the first substrate;
   a column spacer maintaining a cell gap between the first substrate and the second substrate;
   a pixel electrode electrically connected to a switching device; and
   a dummy pattern disposed adjacent to the column spacer, the first substrate comprising:
   a gate line extending in a direction;
   a data line crossing with the gate line;

the switching device electrically connected to the gate line and the data line, the switching device comprising a gate electrode, a source electrode, and a drain electrode, wherein the column spacer overlaps the gate line.

2. The display panel of claim 1, wherein the dummy pattern is disposed in the same layer as the source electrode.

3. The display panel of claim 2, wherein the dummy pattern comprises the same material as the source electrode.

4. The display panel of claim 1, wherein a gap between the dummy pattern and the source electrode is smaller than a diameter of a surface of the dummy pattern contacting the first substrate.

5. The display panel of claim 1, wherein the dummy pattern is electrically floated.

6. The display panel of claim 1 wherein the dummy pattern overlaps the gate electrode.

7. The display panel of claim 2, wherein the dummy pattern comprises an arc shape partially surrounding the source electrode.

8. The display panel of claim 1, wherein the dummy pattern comprises a first sub-dummy pattern and a second sub-dummy pattern, the first sub-dummy pattern comprising a square shape and the second sub-dummy pattern comprising a frame shape surrounding the first sub-dummy pattern.

9. The display panel of claim 8, wherein a gap between the first sub-dummy pattern and the second sub-dummy pattern is smaller than a diameter of the surface of the column spacer contacting the first substrate.

10. The display panel of claim 1, wherein the dummy pattern is spaced apart from the data line and is disposed in the same layer as the data line.

11. The display panel of claim 10, wherein the dummy pattern comprises a first dummy pattern and a second dummy pattern, wherein the first dummy pattern is disposed in the same layer as the data line, and the second dummy pattern is disposed in the same layer as the gate line.

12. The display panel of claim 11, further comprising an active pattern disposed between the first dummy pattern and the second dummy pattern.

13. The display panel of claim 10, wherein the dummy pattern comprises a first dummy pattern and a second dummy pattern spaced apart from the first dummy pattern, wherein the data line is disposed between the first dummy pattern and the second dummy pattern.

14. The display panel of claim 1, wherein the dummy pattern comprises a first dummy pattern and a second dummy pattern spaced apart from the first dummy pattern, wherein the gate line is disposed between the first dummy pattern and the second dummy pattern.

15. A method of manufacturing a display panel, comprising:
   forming a gate metal pattern on a substrate, the gate metal pattern comprising a gate electrode and a gate line;
   forming an active pattern overlapping the gate electrode;
   forming a source metal pattern comprising a data line crossing with the gate line, a source electrode contacting the active pattern, a drain electrode spaced apart from the source electrode, and a dummy pattern spaced apart from the data line, the source electrode, and the drain electrode;
   forming a pixel electrode electrically contacting the drain electrode; and
   disposing a column spacer overlapping the gate line.

16. The method of claim 15, wherein the dummy pattern comprises a first dummy pattern and a second dummy pattern, wherein the data line is disposed between the first dummy pattern and the second dummy pattern.

17. The method of claim 15, wherein the dummy pattern is adjacent to the source electrode and comprises an arc shape partially surrounding the source electrode.

18. The method of claim 15, wherein the dummy pattern overlaps the gate line.

19. The method of claim 15, wherein a gap between the dummy pattern and the source electrode is smaller than a diameter of a surface of the column spacer contacting the substrate.

20. The display panel of claim 1, wherein the column spacer and the dummy pattern are disposed in different horizontal planes.

* * * * *